US012727289B2

(12) United States Patent
Kim et al.

(10) Patent No.: US 12,727,289 B2
(45) Date of Patent: Sep. 1, 2026

(54) DISPLAY DEVICE AND MANUFACTURING FOR THE SAME

(71) Applicant: Samsung Display Co., LTD., Yongin-si (KR)

(72) Inventors: Kyung Bae Kim, Yongin-si (KR); Ji Hye Lee, Yongin-si (KR); Jong Woong Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 512 days.

(21) Appl. No.: 18/107,045

(22) Filed: Feb. 8, 2023

(65) Prior Publication Data

US 2023/0282776 A1 Sep. 7, 2023

(30) Foreign Application Priority Data

Feb. 24, 2022 (KR) ........................ 10-2022-0024350

(51) Int. Cl.

| | |
|---|---|
| ***H10H 20/831*** | (2025.01) |
| ***H10H 20/01*** | (2025.01) |
| ***H10H 20/851*** | (2025.01) |
| ***H10H 20/857*** | (2025.01) |
| ***H10W 90/00*** | (2026.01) |

(52) U.S. Cl.

CPC .......... *H10H 20/831* (2025.01); *H10H 20/01* (2025.01); *H10H 20/8514* (2025.01); *H10H 20/857* (2025.01); *H10W 90/00* (2026.01); *H10H 20/032* (2025.01); *H10H 20/0364* (2025.01)

(58) Field of Classification Search

CPC combination set(s) only.
See application file for complete search history.

(56) References Cited

U.S. PATENT DOCUMENTS

| | | | |
|---|---|---|---|
| 11,424,288 | B2 | 8/2022 | Chai et al. |
| 11,550,087 | B2 | 1/2023 | Park et al. |
| 2021/0242381 | A1 | 8/2021 | Lee et al. |

(Continued)

FOREIGN PATENT DOCUMENTS

| | | | |
|---|---|---|---|
| KR | 10-2020-0097869 | A | 8/2020 |
| KR | 10-2021-0102560 | | 8/2021 |

(Continued)

*Primary Examiner* — Mark W Tornow
*Assistant Examiner* — Priya M Rampersaud
(74) *Attorney, Agent, or Firm* — Womble Bond Dickinson (US) LLP

(57) ABSTRACT

A display device includes a bank disposed on a substrate, the bank surrounding at least a portion of each of a first emission area and a second emission area in a plan view; first alignment electrodes, at least a number of the first alignment electrodes being disposed in the first emission area; second alignment electrodes, at least a number of the second alignment electrodes being disposed in the second emission area; and a light emitting element disposed in each of the first emission area and the second emission area. An electrode most adjacent to the second emission area among the first alignment electrodes and an electrode most adjacent to the first emission area among the second alignment electrodes are spaced apart from each other with a dividing line disposed therebetween, and the dividing line overlaps the bank in a plan view.

15 Claims, 25 Drawing Sheets

(56) References Cited

U.S. PATENT DOCUMENTS

| | | | | |
|---|---|---|---|---|
| 2021/0249392 | A1 | 8/2021 | Woo et al. | |
| 2021/0305222 | A1 | 9/2021 | Min et al. | |
| 2021/0391503 | A1 | 12/2021 | Lee et al. | |
| 2021/0399069 | A1* | 12/2021 | Kim | H10K 59/88 |
| 2022/0011487 | A1* | 1/2022 | Park | G09G 3/035 |
| 2022/0199677 | A1* | 6/2022 | Park | H10H 20/831 |
| 2022/0246802 | A1* | 8/2022 | Kim | H10H 20/8514 |
| 2022/0336707 | A1* | 10/2022 | Shin | H10H 29/142 |
| 2023/0102618 | A1* | 3/2023 | Yun | H01L 25/0753 257/98 |
| 2023/0320157 | A1* | 10/2023 | Jang | H10K 59/173 257/4 |

FOREIGN PATENT DOCUMENTS

| | | | |
|---|---|---|---|
| KR | 10-2021-0155440 | A | 12/2021 |
| KR | 10-2022-0006164 | A | 1/2022 |

* cited by examiner

EMA1
NEA
EMA2
1200
1400
BNK
ELT4_1
ELT1_2
INS1
SUB/PCL
II
II'
1020
DR3
DR1
DR2

DISPLAY DEVICE AND MANUFACTURING FOR THE SAME

CROSS-REFERENCE TO RELATED APPLICATION(S)

This application claims priority to and benefits of Korean patent application No. 10-2022-0024350 under 35 U.S.C. § 119 filed on Feb. 24, 2022 in the Korean Intellectual Property Office, the entire contents of which are incorporated herein by reference.

BACKGROUND

1. Technical Field

The disclosure generally relates to a display device and a manufacturing method for the same.

2. Description of the Related Art

Recently, as interest in information displays is increased, research and development of display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device and a manufacturing method for the same, in which luminance can be improved, and occurrence of a dark spot in an emission area can be prevented.

In accordance with an aspect of the disclosure, there is provided a display device that may include a bank disposed on a substrate, the bank surrounding at least a portion of each of a first emission area and a second emission area in a plan view; first alignment electrodes, at least a number of the first alignment electrodes being disposed in the first emission area; second alignment electrodes, at least a number of the second alignment electrodes being disposed in the second emission area; and a light emitting element disposed in each of the first emission area and the second emission area, wherein an electrode most adjacent to the second emission area among the first alignment electrodes and an electrode most adjacent to the first emission area among the second alignment electrodes are spaced apart from each other including a dividing line disposed between the electrode most adjacent to the second emission area among the first alignment electrodes and the electrode most adjacent to the first emission area among the second alignment electrodes, and the dividing line overlaps the bank in a plan view.

The bank may have a shape that protrudes in a thickness direction of the substrate. The first emission area and the second emission area may not overlap the bank in a plan view.

The first emission area and the second emission area may be adjacent to each other in a first direction. The dividing line may extend in a second direction different from the first direction.

Each of the first alignment electrodes and the second alignment electrodes may include even-numbered alignment electrodes.

Light emitting units may be disposed in each of the first emission area and the second emission area. Each of the light emitting units may include the light emitting element. The light emitting units may be adjacent to a first direction, and extend in a second direction different from the first direction.

A number of the light emitting units in the first emission area and the second emission area may be an odd number.

The light emitting units in each of the first emission area and the second emission area may include a first light emitting unit, a second light emitting unit, and a third light emitting unit. The first light emitting unit, the second light emitting unit, and the third light emitting unit may not overlap each other in the second direction.

Each of the first alignment electrodes may alternately provide an AC signal and a ground signal in case that the light emitting element is aligned, and each of the second alignment electrodes may alternately provide an AC signal and a ground signal in case that the light emitting element is aligned.

The first alignment electrodes may include a (1_1)th electrode, a (2_1)th electrode, a (3_1)th electrode, and a (4_1)th electrode, and the second alignment electrodes may include a (1_2)th electrode, a (2_2)th electrode, a (3_2)th electrode, and a (4_2)th electrode. The (1_1)th electrode, the (1_2)th electrode, the (3_1)th electrode, and the (3_2)th electrode may provide an AC signal in case that the light emitting element is aligned, and the (2_1)th electrode, the (2_2)th electrode, the (4_1)th electrode, and the (4_2)th electrode may provide a ground signal in case that the light emitting element is aligned.

A position of the (1_1)th electrode in the first emission area may correspond to a position of the (1_2)th electrode in the second emission area, a position of the (2_1)th electrode in the first emission area may correspond to a position of the (2_2)th electrode in the second emission area, a position of the (3_1)th electrode in the first emission area may correspond to a position of the (3_2)th electrode in the second emission area, and a position of the (4_1)th electrode in the first emission area may correspond to a position of the (4_2)th electrode in the second emission area.

An electrode most adjacent to the second emission area among the first alignment electrodes may provide a signal to the light emitting element in the first emission area different from a signal which an electrode most adjacent to the first emission area among the second alignment electrodes provides to the light emitting element.

The light emitting units in each of the first emission area and the second emission area may include a first light emitting unit, a second light emitting unit, and a third light emitting unit. The light emitting element of the first light emitting unit, the light emitting element of the second light emitting unit, and the light emitting element of the third light emitting unit may be sequentially electrically connected.

The display device may further include sub-pixels emitting lights of different colors. The first emission area and the second emission area may correspond to each of the sub-pixels. The (1_1)th electrode and the (3_1)th electrode may be separated from electrodes of another adjacent sub-pixel, and the (1_2)th electrode and the (3_2)th electrode may be separated from electrodes of another adjacent sub-pixel.

The (2_1)th electrode and the (4_1)th electrode may be separated from electrodes of another adjacent sub-pixel, and the (2_2)th electrode and the (4_2)th electrode may be separated from electrodes of another adjacent sub-pixel.

The display device may further include sub-pixels emitting lights of different colors. The display device may include a color conversion layer overlapping a display element layer in which the light emitting element is disposed in a plan view, the color conversion layer changes a wavelength of light; and a color filter layer overlapping the color conversion layer in a plan view, the color filter layer selectively transmitting light. The first emission area and the second emission area may correspond to each of the sub-pixels.

The dividing line may be a virtual line.

In accordance with another aspect of the disclosure, there is provided a display device that may include a first sub-pixel disposed on a substrate, the first sub-pixel overlapping a first emission area; a second sub-pixel disposed on the substrate, the second sub-pixel overlapping a second emission area, the second sub-pixel being adjacent to the first sub-pixel in a first direction; a (1_1)th electrode, a (2_1)th electrode, a (3_1)th electrode, and a (4_1)th electrode, each of which at least a portion is disposed in the first emission area, the (1_1)th electrode, the (2_1)th electrode, the (3_1)th electrode, and the (4_1)th electrode, being adjacent to each other in the first direction; a (1_2)th electrode, a (2_2)th electrode, a (3_2)th electrode, and a (4_2)th electrode, each of which at least a portion is disposed in the second emission area, the (1_2)th electrode, the (2_2)th electrode, the (3_2)th electrode, and the (4_2)th electrode, being adjacent to each other in the first direction; and a bank disposed on the substrate, wherein arrangement positions of the (1_1)th electrode, the (2_1)th electrode, the (3_1)th electrode, and the (4_1)th electrode and arrangement positions of the (1_2)th electrode, the (2_2)th electrode, the (3_2)th electrode, and the (4_2)th electrode correspond to each other, an electrical signal provided to the (4_1)th electrode is different from an electrical signal provided to the (1_2)th electrode, and the bank overlaps a dividing line between the (4_1)th electrode and the (1_2)th electrode in a plan view.

The electrical signal provided to the (4_1)th electrode may be a ground signal, and the electrical signal provided to the (1_2)th electrode may be an AC signal.

In accordance with the disclosure, there is provided a method for manufacturing a display device, the method may include disposing alignment electrodes on a substrate; disposing a bank on the substrate; and disposing a light emitting element on the substrate, the disposing of the bank may include emission areas, wherein the emission area may include a first emission area and a second emission area, the disposing of the light emitting element may include disposing the light emitting element in the first emission area and the second emission area, and a dividing line distinguishing the first emission area and the second emission area from each other overlaps the bank in a plan view.

The first emission area and the second emission area may be adjacent to each other in a first direction. The dividing line may extend in a second direction different from the first direction.

Light emitting units may be disposed in each of the first emission area and the second emission area. Each of the light emitting units may include the light emitting element. The light emitting units may be adjacent to each other in a first direction, and extend in a second direction different from the first direction. The light emitting units in each of the first emission area and the second emission area may include a first light emitting unit, a second light emitting unit, and a third light emitting unit. The first light emitting unit, the second light emitting unit, and the third light emitting unit may not overlap each other in the second direction.

The disposing of the light emitting element may include accommodating an ink including the light emitting element in a space defined by the bank, without being arranged at a position overlapping the dividing line.

The alignment electrodes may include even-numbered first alignment electrodes in the first emission area and even-numbered second alignment electrodes in the second emission area. Each of the first alignment electrodes and the second alignment electrodes may include a first root electrode providing a first alignment signal, a first electrode, a third electrode, a second root electrode providing a second alignment signal, a second electrode, and a fourth electrode. The disposing of the light emitting element may include: providing the first alignment signal to the first electrode and the third electrode through the first root electrode; and providing the second alignment signal to the second electrode and the fourth electrode through the second root electrode.

The alignment electrodes may include first alignment electrodes in the first emission area; and second alignment electrodes in the second emission area. Each of the first alignment electrodes and the second alignment electrodes may include a first root electrode providing an AC signal, a first electrode, a third electrode, a second root electrode providing a ground signal, a second electrode, and a fourth electrode. The first root electrode of the first emission area may be electrically connected to alignment electrodes in an emission area adjacent to the first emission area among the emission areas. The method may further include cutting off the first root electrode.

The cutting off of the first root electrode may be performed before the disposing of the light emitting element.

In accordance with an aspect of the disclosure, there is provided a display device manufactured according to the method.

BRIEF DESCRIPTION OF THE DRAWINGS

The above and other aspects and features of the disclosure will become more apparent by describing in detail embodiments thereof with reference to the attached drawings, in which:

FIG. 6 is a schematic diagram illustrating a pixel circuit included in a sub-pixel in accordance with an embodiment.

FIG. 14 is a schematic cross sectional view taken along line II-II' shown in FIG. 13.

FIGS. 15, 16, 19, and 23 to 25 are schematic process plan views illustrating a manufacturing method for the display device in accordance with an embodiment.

FIGS. 17, 18, and 20 to 22 are schematic process plan views illustrating a manufacturing method for the display device in accordance with an embodiment.

DETAILED DESCRIPTION OF THE EMBODIMENTS

Figure 1:
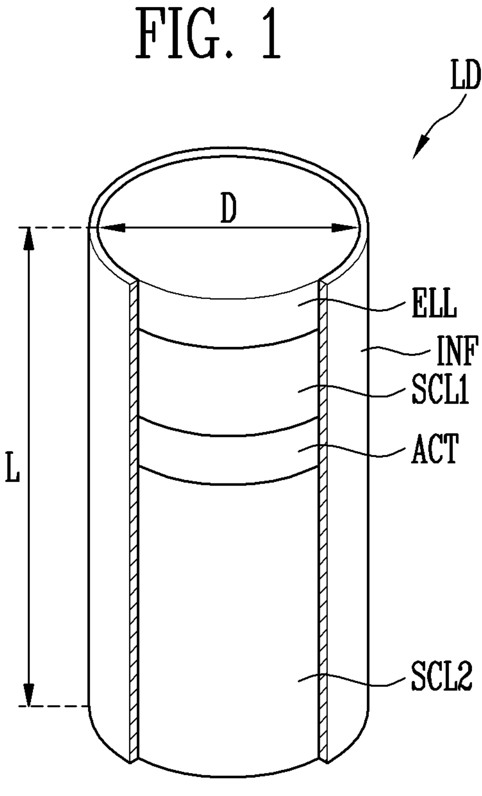
FIGS. 1 and 2 are schematic perspective and cross sectional views illustrating a light emitting element in accordance with an embodiment.

The disclosure may apply various changes and different shapes, therefore the disclosure includes examples. However, the examples are not limited to certain shapes but is applicable to all changes and equivalent materials and replacements.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

It will be understood that, although the terms “first”, “second”, etc. may be used herein to describe various elements, these elements should not be limited by these terms. These terms are only used to distinguish one element from another element. Thus, a “first” element discussed below could also be termed a “second” element without departing from the teachings of the disclosure.

As used herein, the singular forms are intended to include the plural forms as well, unless the context clearly indicates otherwise. For example, as used herein, the singular forms, “a,” “an,” and “the” are intended to include the plural forms as well, unless the context clearly indicates otherwise.

In the specification and the claims, the term “and/or” is intended to include any combination of the terms “and” and “or” for the purpose of its meaning and interpretation. For example, “A and/or B” may be understood to mean “A, B, or A and B.” The terms “and” and “or” may be used in the conjunctive or disjunctive sense and may be understood to be equivalent to “and/or.”

In the specification and the claims, the phrase “at least one of” is intended to include the meaning of “at least one selected from the group of” for the purpose of its meaning and interpretation. For example, “at least one of A and B” may be understood to mean “A, B, or A and B.”

It will be further understood that the terms “comprises,” “comprising,” “includes,” and/or “including,”, “has,” “have,” and/or “having,” and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, an expression that an element such as a layer, region, substrate or plate is placed “on” or “above” another element indicates not only a case where the element is placed “directly on” or “just above” the other element but also a case where a further element is interposed between the element and the other element. On the contrary, an expression that an element such as a layer, region, substrate or plate is placed “beneath” or “below” another element indicates not only a case where the element is placed “directly beneath” or “just below” the other element but also a case where a further element is interposed between the element and the other element.

It will be understood that when an element (or a region, a layer, a portion, or the like) is referred to as “being on”, “connected to” or “coupled to” another element in the specification, it can be directly disposed on, connected or coupled to another element mentioned above, or intervening elements may be disposed therebetween.

It will be understood that the terms “connected to” or “coupled to” may include a physical or electrical connection or coupling.

The terms “overlap” or “overlapped” mean that a first object may be above or below or to a side of a second object, and vice versa. Additionally, the term “overlap” may include layer, stack, face or facing, extending over, covering, or partly covering or any other suitable term as would be appreciated and understood by those of ordinary skill in the art.

When an element is described as ‘not overlapping’ or ‘to not overlap’ another element, this may include that the elements are spaced apart from each other, offset from each other, or set aside from each other or any other suitable term as would be appreciated and understood by those of ordinary skill in the art.

The terms “face” and “facing” mean that a first element may directly or indirectly oppose a second element. In a case in which a third element intervenes between the first and second element, the first and second element may be understood as being indirectly opposed to one another, although still facing each other. “About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The disclosure generally relates to a display device. Hereinafter, a display device in accordance with an embodiment will be described with reference to the accompanying drawings.

A light emitting element LD in accordance with an embodiment will be described with reference to FIGS. 1 to 4.

Figure 2:
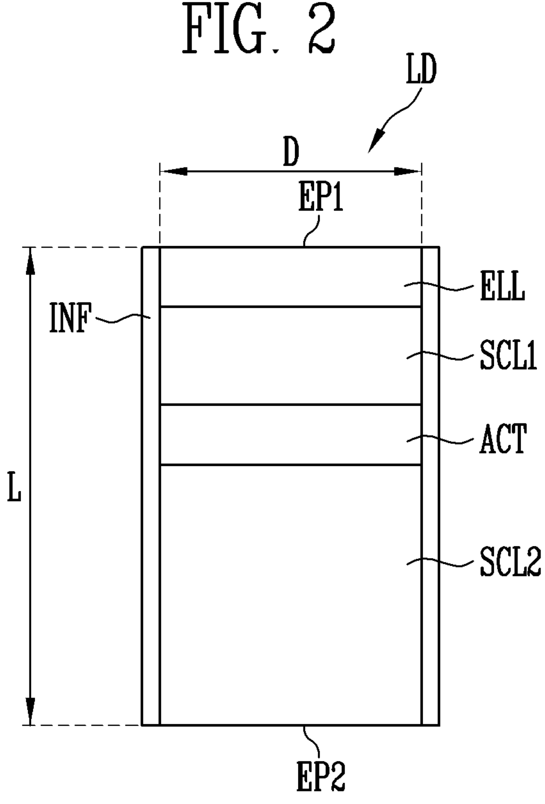
Figure 3:
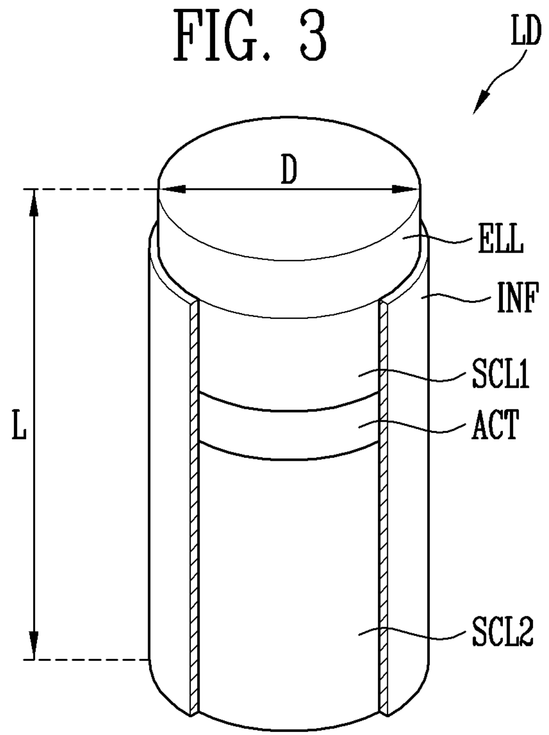
FIGS. 3 and 4 are schematic perspective and cross sectional views illustrating a light emitting element in accordance with an embodiment.
Figure 4:
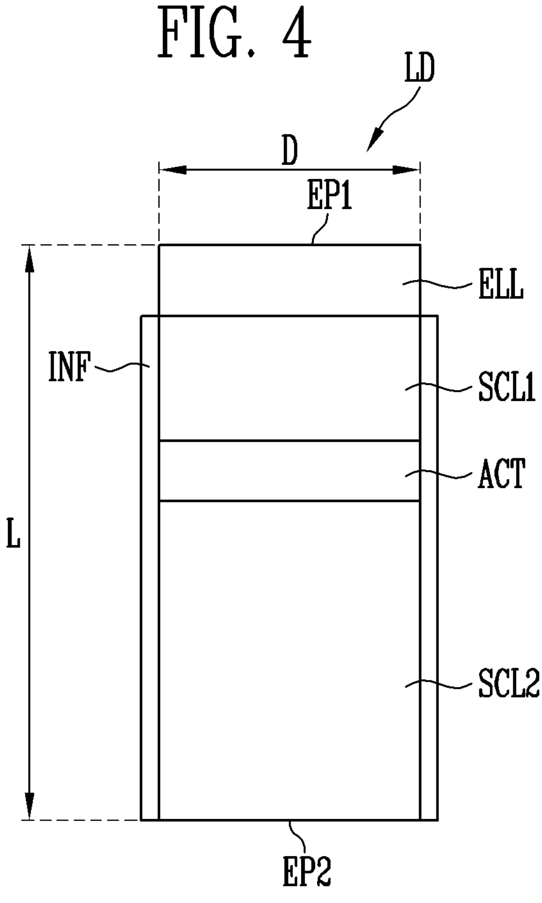

FIGS. 1 and 2 are schematic perspective and sectional views illustrating a light emitting element in accordance with an embodiment. FIGS. 3 and 4 are schematic perspective and sectional views illustrating a light emitting element in accordance with an embodiment.

Although a pillar-shaped light emitting element LD is illustrated in FIGS. 1 to 4, the kind and/or shape of the light emitting element LD is not limited thereto.

The light emitting element LD may include a second semiconductor layer SCL2, a first semiconductor layer SCL1, and an active layer ACT interposed between the first and second semiconductor layers SCL1 and SCL2. For example, in case that assuming that an extending direction of the light emitting element LD is a length L direction, the light emitting element LD may include the first semiconductor layer SCL1, the active layer ACT, and the second semiconductor layer SCL2, which may be sequentially stacked each other along the length L direction. The light emitting element LD may further include an electrode layer ELL and an insulative film INF.

The light emitting element LD may be provided in a pillar shape extending along one direction or direction. The light emitting element LD may have a first end portion EP1 and a second end portion EP2. The first semiconductor layer SCL1 may be adjacent to the first end portion EP1, and the second semiconductor layer SCL2 may be adjacent to the second end portion EP2. The electrode layer ELL may be adjacent to the first end portion EP1.

The light emitting element LD may be a light emitting element manufactured in a pillar shape through an etching process, or the like within the spirit and the scope of the disclosure. In this specification, the term "pillar shape" may include a rod-like shape or bar-like shape, which is long in the length L direction (for example, its aspect ratio is greater than 1), such as a cylinder or a polyprism, and the shape of its section is not particularly limited. For example, a length L of the light emitting element LD may be greater than a diameter D (or a width of a cross-section) of the light emitting element LD.

The light emitting element LD may have a size of nanometer scale to micrometer scale. For example, the light emitting element LD may have a diameter D (or width) in a range of nanometer scale to micrometer scale and/or a length L in a range of nanometer scale to micrometer scale. However, the size of the light emitting element LD is not limited thereto.

The first semiconductor layer SCL1 may be a first conductivity type semiconductor layer. The first semiconductor layer SCL1 is disposed on the active layer ACT, and may include a semiconductor layer having a type different from a type of the second semiconductor layer SCL2. For example, the first semiconductor layer SCL1 may include a P-type semiconductor layer. In an example, the first semiconductor layer SCL1 may include at least one semiconductor material among InAlGaN, GaN, AlGaN, InGaN, AlN, and InN, and include a P-type semiconductor layer doped with a first conductivity type dopant such as Mg. However, the material constituting the first semiconductor layer SCL1 is not limited thereto. The first semiconductor layer SCL1 may include various materials.

The active layer ACT is disposed between the first semiconductor layer SCL1 and the second semiconductor layer SCL2, and may be formed in a single-quantum well structure or a multi-quantum well structure. The position of the active layer ACT is not limited to a specific example, and may be variously changed according to the kind of the light emitting element LD.

A clad layer doped with a conductive dopant may be formed on the top and/or the bottom of the active layer ACT. For example, the clad layer may be formed as an AlGaN layer or an InAlGaN layer. In an embodiment, a material such as AlGaN or AlInGaN may be used to form the active layer ACT. The active layer ACT may include various materials.

The second semiconductor layer SCL2 may be a second conductivity type semiconductor layer. The second semiconductor layer SCL2 is disposed on the active layer ACT, and may include a semiconductor layer having a type different from the type of the first semiconductor layer SCL1. For example, the second semiconductor layer SCL2 may include an N-type semiconductor layer. For example, the second semiconductor layer SCL2 may include any one semiconductor material among InAlGaN, GaN, AlGaN, InGaN, AlN, and InN, and include an N-type semiconductor layer doped with a second conductivity type dopant such as Si, Ge or Sn. However, the material constituting the second semiconductor layer SCL2 is not limited thereto. The second semiconductor layer SCL2 may include various materials.

In case that a voltage which is a threshold voltage or more is applied to both ends of the light emitting element LD, the light emitting element LD emits light as electron-hole pairs are combined in the active layer ACT. The light emission of the light emitting element LD is controlled by using such a principle, so that the light emitting element LD can be used as a light source for various light emitting devices, including a pixel of a display device.

The insulative film INF may be disposed on a surface of the light emitting element LD. The insulative film INF may be formed on the surface of the light emitting element LD to surround an outer circumferential surface of at least the active layer ACT. The insulative film INF may further surround one area or areas of the first and second semiconductor layers SCL1 and SCL2. The insulative film INF may be formed as a single layer or a multi-layer. However, the disclosure is not limited thereto, and the insulative film INF may be formed of layers. For example, the insulative film INF may include a first insulating layer including a first material and a second insulating layer including a second material different from the first material.

The insulative film INF may expose both the end portions of the light emitting element LD, which have different polarities. For example, the insulative film INF may expose one end or an end of each of the electrode layer ELL and the second semiconductor layer SCL2, which are respectively adjacent to the first and second end portions EP1 and EP2 of the light emitting element LD.

The insulative film INF may be a single layer or a multi-layer, including one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not necessarily limited to the above-described example. For example, in accordance with an embodiment, the insulative film INF may be omitted.

In accordance with an embodiment, in case that the insulative film INF is provided to cover the surface of the light emitting element LD, for example, the outer circumferential surface of the active layer ACT, the electrical stability of the light emitting element LD can be ensured. Also, in case that the insulative film INF is provided on the surface of the light emitting element LD, a surface defect of the light emitting element LD is minimized, thereby improving the lifetime and efficiency of the light emitting element LD. Even in case that light emitting elements LD are densely disposed, an unwanted short circuit can be prevented from occurring between the light emitting elements LD.

The electrode layer ELL may be disposed on the first semiconductor layer SCL1. The electrode layer ELL may be adjacent to the first end portion EP1. The electrode layer ELL may be electrically connected to the first semiconductor layer SCL1.

A portion of the electrode layer ELL may be exposed. For example, the insulative film INF may expose one surface or a surface of the electrode layer ELL. The electrode layer ELL may be exposed in an area corresponding to the first end portion EP1.

In an embodiment, a side surface of the electrode layer ELL may be exposed (see FIGS. 3 and 4). For example, the insulative film INF may not cover at least a portion of the side surface of the electrode layer ELL while covering a side surface of each of the first semiconductor layer SCL1, the active layer ACT, and the second semiconductor layer SCL2. Thus, the electrode layer ELL adjacent to the first end portion EP1 can be readily connected to another component. In an embodiment, the insulating layer INF may expose not only the side surface of the electrode layer ELL but also a portion of a side surface of the first semiconductor layer SCL1 and/or the second semiconductor layer SCL2.

In accordance with an embodiment, the electrode layer ELL may be an ohmic contact electrode. However, the disclosure is not necessarily limited to the above-described example. For example, the electrode layer ELL may be a Schottky contact electrode.

In accordance with an embodiment, the electrode layer ELL may include one of chromium (Cr), titanium (Ti), aluminum (Al), gold (Au), nickel (Ni), indium tin oxide (ITO), and any oxide or ally thereof. However, the disclosure is not necessarily limited to the above-described example. In an embodiment, the electrode layer ELL may be substantially transparent. Accordingly, emitted light can be transmitted through the electrode layer ELL.

The structure, shape, and the like of the light emitting element LD are not limited to the above-described example. In an embodiment, the light emitting element LD may have various structures and various shapes. For example, the light emitting element LD may further include an additional electrode layer which is disposed on one surface or a surface of the second semiconductor layer SCL2 and is adjacent to the second end portion EP2.

Figure 5:
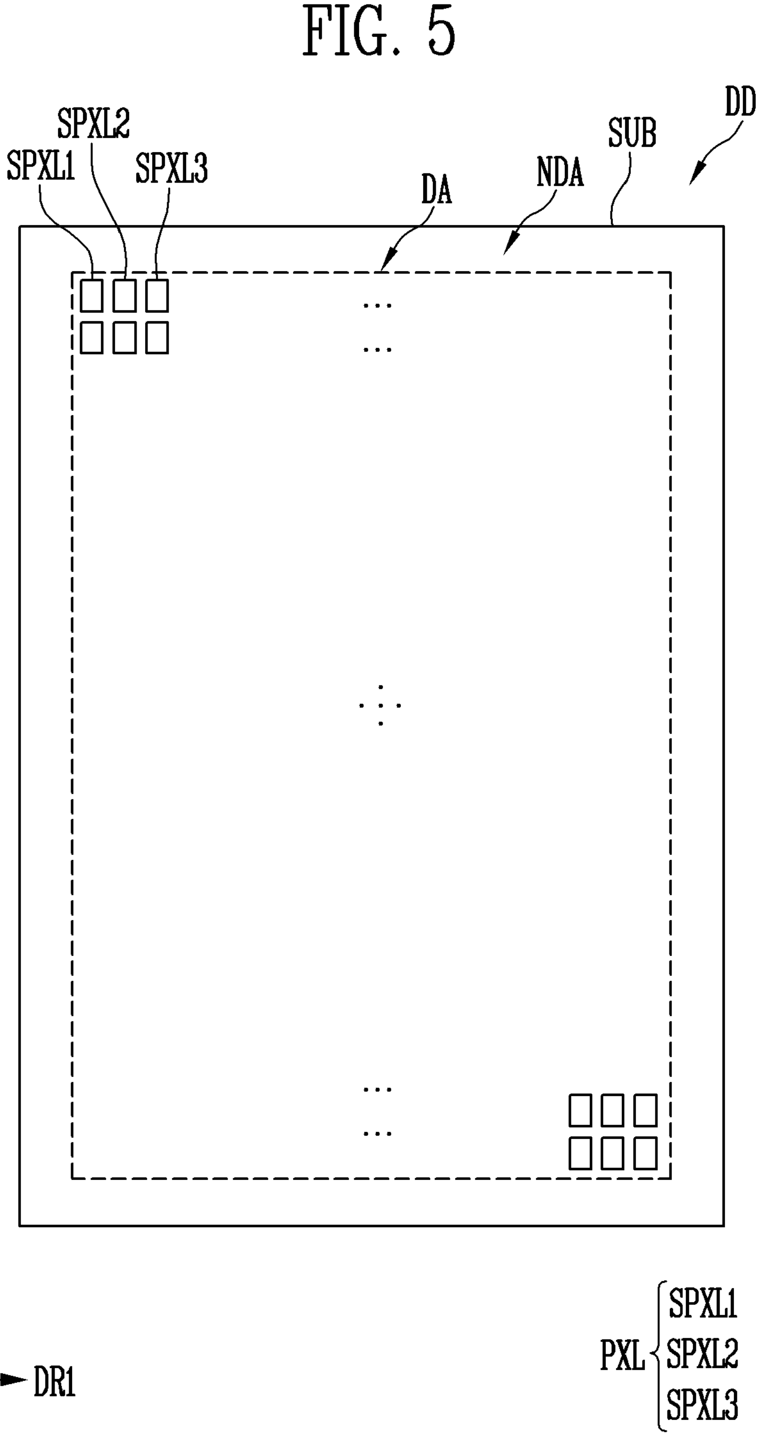
FIG. 5 is a schematic plan view schematically illustrating a display device in accordance with an embodiment.

FIG. 5 is a plan view schematically illustrating a display device in accordance with an embodiment.

The display device DD may emit light. Referring to FIG. 5, the display device DD may include a substrate SUB and pixels PXL arranged or disposed on the substrate SUB. Although not shown in the drawing, the display device DD may further include a driving circuit (for example, a scan driver and a data driver) for driving the pixels PXL, lines, and pads.

The display device DD may include a display area DA and a non-display area NDA. The non-display area NDA may mean an area except the display area DA. The non-display area NDA may surround or may be adjacent to at least a portion of the display area DA.

The substrate SUB may constitute a base member of the display device DD. The substrate SUB may be a rigid or flexible substrate or film, but the disclosure is not limited to a specific example.

The display area DA may mean an area in which the pixels PXL are disposed. The non-display area NDA may mean an area in which the pixels PXL are not disposed. The driving circuit, the lines, and the pads, which are connected to the pixels PXL of the display area DA, may be disposed in the non-display area NDA.

In an example, the pixels PXL may be arranged according to a stripe arrangement structure, a PENTILE™ arrangement structure, or the like within the spirit and the scope of the disclosure. However, the disclosure is not limited thereto, and various embodiments may be applied in the disclosure.

In accordance with an embodiment, the pixel PXL may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. At least one first sub-pixel SPXL1, at least one second sub-pixel SPXL2, and at least one third sub-pixel SPXL3 may constitute one pixel unit capable of emitting lights of various colors.

For example, each of the first sub-pixel SPXL1, the second sub-pixel SPXL2, and the third sub-pixel SPXL3 may emit light of a color. For example, the first sub-pixel SPXL1 may be a red pixel emitting light of red (for example, a first color), the second sub-pixel SPXL2 may be a green pixel emitting light of green (for example, a second color), and the third sub-pixel SPXL3 may be a blue pixel emitting light of blue (for example, a third color). However, the color, kind, and/or number of first, second, and third sub-pixels SPXL1, SPXL2, and SPXL3 constituting each pixel unit are not limited to a specific example.

A pixel circuit PXC in accordance with an embodiment will be described with reference to FIGS. 6 and 7.

Figure 6:
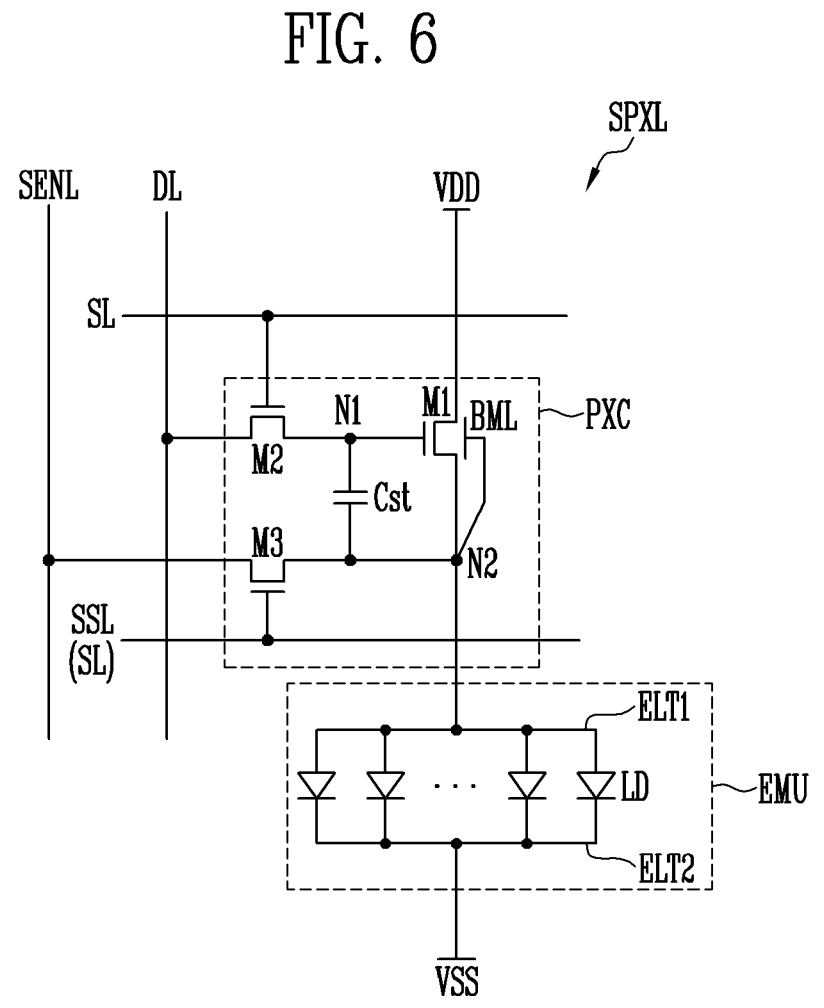

FIG. 6 is a schematic diagram illustrating a pixel circuit included in a sub-pixel in accordance with an embodiment. The sub-pixel SPXL shown in FIG. 6 may mean any one of the first to third sub-pixels SPXL1, SPXL2, and SPXL3 described above with reference to FIG. 5.

Referring to FIG. 6, the sub-pixel SPXL may include a pixel circuit PXC. The pixel circuit PXC may drive a light emitting unit EMU.

The sub-pixel SPXL may be electrically connected to a scan line SL, a data line DL, a first power line VDD, and a second power line VSS. In an embodiment, the sub-pixel SPXL may be selectively further connected to another power line and/or another signal line.

The sub-pixel SPXL may include the light emitting unit EMU to emit light corresponding to a data signal provided from the data line DL.

The pixel circuit PXC may be disposed between the first power line VDD and the light emitting unit EMU. The pixel circuit PXC may be electrically connected to the scan line SL to which a first scan signal is supplied and the data line DL to which a data signal is supplied. Also, the pixel circuit PXC may be electrically connected to a control line SSL to which a second scan signal is supplied, and be electrically connected to a sensing line SENL connected to a reference power source (or initialization power source) or a sensing circuit. In an embodiment, the second scan signal may be identical to or different from the first scan signal. In case that the second scan signal and the first scan signal are identical to each other, the control line SSL and the scan line SL may be integral with each other.

The pixel circuit PXC may include at least one transistor and a capacitor. For example, the pixel circuit PXC may include a first transistor M1, a second transistor M2, a third transistor M3, and a capacitor Cst.

The first transistor M1 may be connected between the first power line VDD and a second node N2. The second node N2 may be a node at which the pixel circuit PXC and the light emitting unit EMU are connected to each other. For example, the second node N2 may be a node at which one electrode (for example, a source electrode) of the first transistor M1 and a first electrode ELT1 (for example, an anode electrode) of the light emitting unit EMU are connected to each other. Agate electrode of the first transistor M1 may be connected to a first node N1. The first transistor M1 may control a driving current supplied to the light emitting unit EMU, corresponding to a voltage of the first node N1.

In an embodiment, the first transistor M1 may further include a bottom metal layer BML (or back gate electrode). The gate electrode and the bottom metal layer BML of the first transistor M1 may overlap each other with an insulating layer interposed therebetween. In an embodiment, the bottom metal layer BML may be connected to the one electrode, for example, the source electrode of the first transistor M1.

In an embodiment in which the first transistor M1 may include the bottom metal layer BML, there may be applied a back-biasing technique (or sync technique) for moving a threshold voltage of the first transistor M1 in a negative direction or positive direction by applying a back-biasing voltage to the bottom metal layer BML of the first transistor M1. In addition, in case that the bottom metal layer BML is disposed on the bottom of a semiconductor pattern constituting a channel of the first transistor M1, the bottom metal layer BML blocks light incident onto the semiconductor pattern, thereby stabilizing operational characteristics of the first transistor M1.

The second transistor M2 may be connected between the data line DL and the first node N1. Agate electrode of the second transistor M2 may be connected to the scan line SL. The second transistor M2 may be turned on in case that the first scan signal having a gate-on voltage (for example, a high level voltage) is supplied from the scan line SL, to connect the data line DL and the first node N1 to each other.

A data signal of a corresponding frame is supplied to the data line for each frame period. The data signal is transferred to the first node N1 through the second transistor M2 during a period in which the first scan signal having the gate-on voltage is supplied. For example, the second transistor M2 may be a switching transistor for transferring each data signal to the inside of the sub-pixel SPXL.

One electrode of the capacitor Cst may be connected to the first node N1, and the other electrode of the capacitor Cst may be connected to the second node N2. The capacitor Cst charges a voltage corresponding to the data signal supplied to the first node N1 during each frame period.

The third transistor M3 may be connected between the second node N2 and the sensing line SENL. A gate electrode of the third transistor M3 may be connected to the control line SSL (or the scan line SL). The third transistor M3 may be turned on in case that the second scan signal (or the first scan signal) having the gate-on voltage (for example, the high level voltage) is supplied from the control line SSL, to transfer, to the second node N2, a reference voltage (or initialization voltage) supplied to the sensing line SENL, or to transfer a voltage of the second node N2 to the sensing line SENL. The voltage of the second node N2, which is transferred to the sensing circuit through the sensing line SENL, may be provided to an external circuit to be used for compensating for a characteristic deviation of sub-pixels SPXL, and the like within the spirit and the scope of the disclosure.

Although a case where the transistors included in the pixel circuit PXC are all N-type transistors is illustrated in FIG. 6, the disclosure is not limited thereto. For example, at least one of the first, second, and third transistors M1, M2, and M3 may be changed to a P-type transistor. The structure and driving method of the sub-pixel SPXL may be variously changed in an embodiment.

The light emitting unit EMU may include the first electrode ELT1, a second electrode ELT2, and at least one light emitting element LD. For example, the light emitting unit EMU may include the first electrode ELT1 connected to the first power line VDD through the first transistor M1, the second electrode ELT2 connected to the second power line VSS, and the at least one light emitting elements LD connected between the first electrode ELT1 and the second electrode ELT2. In an embodiment, the light emitting unit EMU may include light emitting elements LD connected in parallel between the first electrode ELT1 and the second electrode ELT2.

A power source of the first power line VDD and a power source of the second power line VSS may have different potentials. For example, the power source of the first power line VDD may be a high-potential pixel power source, and the power source of the second power line VSS may be a low-potential pixel power source. A potential difference between the power source of the first power line VDD and the power source of the second power line VSS may be set equal to or higher than a threshold voltage of the light emitting elements LD.

The emitting elements LD may be connected in a forward direction between the first power line VDD and the second power line VSS to form respective effective light sources. These effective light sources constitute the light emitting unit EMU of the sub-pixel SPXL.

The light emitting elements LD may emit light with a luminance corresponding to a driving current supplied through the pixel circuit PXC. The pixel circuit PXC may supply a driving current corresponding to a data signal to the light emitting unit EMU during each frame period. The driving current supplied to the light emitting unit EMU may be divided to flow through the light emitting elements LD. Accordingly, the light emitting unit EMU can emit light with a luminance corresponding to the driving current while each light emitting element LD emits light with a luminance corresponding to a current flowing therethrough.

Although an embodiment in which the sub-pixel SPXL may include the light emitting unit EMU having a parallel structure is disclosed in FIG. 6, the disclosure is not limited thereto. For example, the sub-pixel SPX may include a light emitting unit EMU having a serial structure or a series/parallel structure. The light emitting unit EMU may include light emitting elements LD connected in series or series/parallel between the first electrode ELT1 and the second electrode ELT2. By way of example, the sub-pixel SPXL may include only a single light emitting element LD connected between the first electrode ELT1 and the second electrode ELT2.

The pixel circuit PXC of the sub-pixel SPXL in accordance with an embodiment is not limited to the above-described example. Hereinafter, a pixel circuit PXC in accordance with an embodiment will be described with reference to FIG. 7. In FIG. 7, descriptions of portions overlapping those described above will be omitted or simplified.

Figure 7:
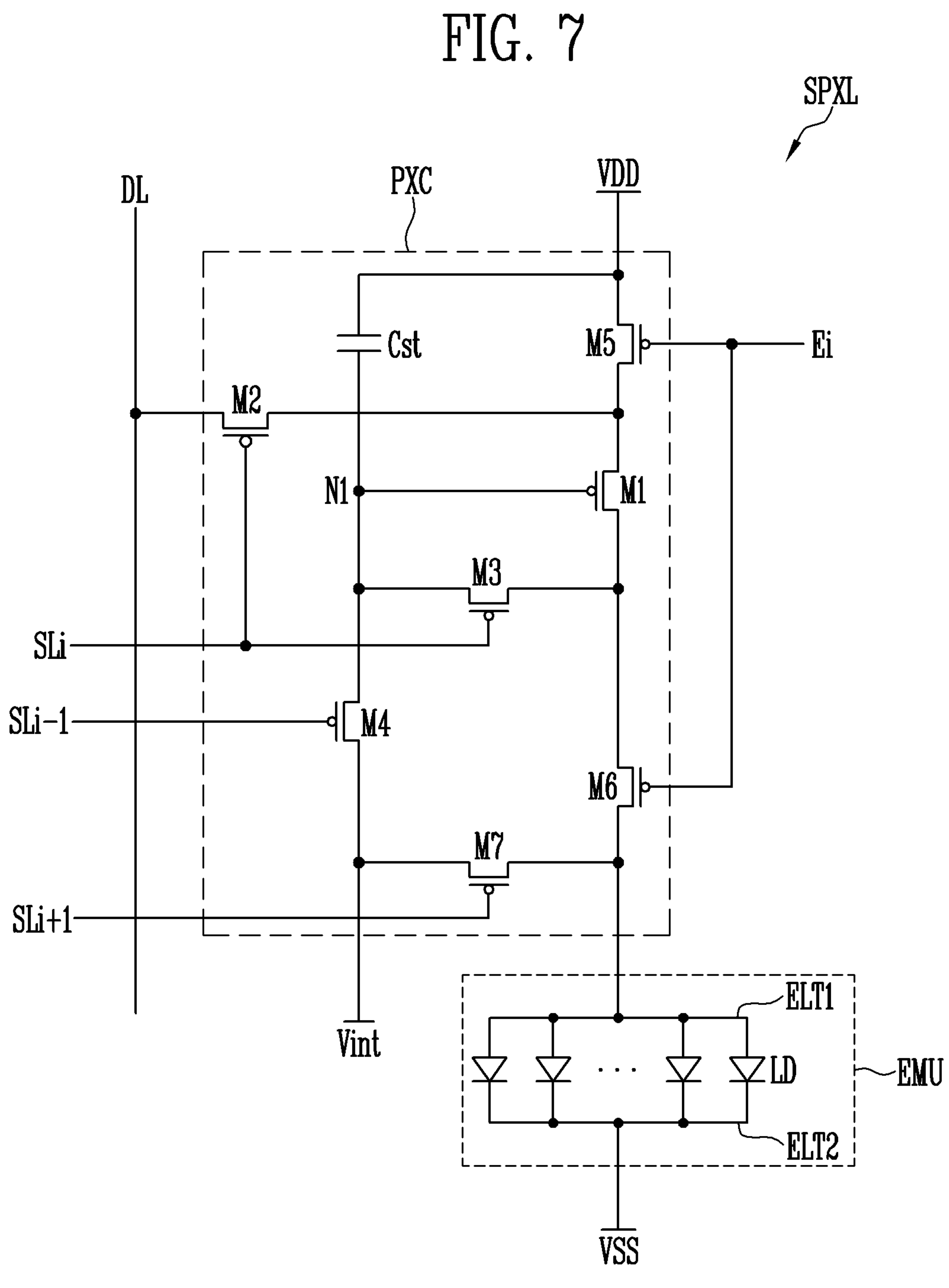
FIG. 7 is a schematic diagram illustrating a pixel circuit included in a sub-pixel in accordance with an embodiment.

FIG. 7 is a schematic diagram illustrating a pixel circuit included in a sub-pixel in accordance with an embodiment. The sub-pixel SPXL shown in FIG. 7 may mean any one of the first to third sub-pixels SPXL1, SPXL2, and SPXL3 described above with reference to FIG. 5.

Referring to FIG. 7, the sub-pixel SPXL may include a pixel circuit PXC. The pixel circuit PXC may drive a light emitting unit EMU.

The pixel circuit PXC may include first to seventh transistors M1 to M7 and a storage capacitor Cst. The pixel circuit PXC may be electrically connected to the light emitting unit EMU. The pixel circuit PXC may be electrically connected to at least one light emitting element LD.

One electrode of the first transistor M1 may be connected to a first power line VDD via the fifth transistor M5, and the other electrode of the first transistor M1 may be connected to a first electrode ELT1 (for example, an anode electrode) of the light emitting unit EMU via the sixth transistor M6. The first transistor M1 may control current data flowing from the first power line VDD to a second power line VSS via the light emitting unit EMU, based on information on a voltage of a first node N1. The first transistor M1 may be a driving transistor.

The second transistor M2 may be connected between the one electrode of the first transistor M1 and a data line DL. A gate electrode of the second transistor M2 may be connected to an ith scan line SLi. The second transistor M2 may be turned on in case that a scan signal is applied from the ith scan line SLi, and electrically connect the data line DL and the one electrode of the first transistor M1 to each other. The second transistor M2 may be a switching transistor.

The third transistor M3 may be connected between the other electrode of the first transistor M1 and the first node N1. The third transistor M3 may be turned on in case that the scan signal having a gate-on voltage is applied from the ith scan line SLi, and electrically connect the other electrode of the first transistor M1 and the first node N1 to each other. In case that the third transistor M3 is turned on, the first transistor M1 may be connected in a diode form.

The fourth transistor M4 may be connected between the first node and an initialization power line Vint. A gate electrode of the fourth transistor M4 may be connected to an (i−1)th scan line SLi−1. The fourth transistor M4 may be turned on in case that a scan signal is applied from the (i−1)th scan line SLi−1, to supply a voltage of the initialization power line Vint to the first node N1. The fourth transistor M4 may be an initialization transistor.

The fifth transistor M5 may be connected between the first power line VDD and the first transistor M1. Agate electrode of the fifth transistor M5 may be connected to an ith emission control line Ei. The fifth transistor M5 may be turned off in case that an emission control signal having a gate-off voltage is applied to the ith emission control line Ei, and be turned on in other cases.

The sixth transistor M6 may be connected between the first transistor M1 and the light emitting unit EMU. A gate electrode of the sixth transistor M6 may be connected to the ith emission control line Ei. The sixth transistor M6 may be turned off in case that the emission control signal having a gate-off voltage (for example, a high level voltage) is applied from the ith emission control line Ei, and be turned on in other cases.

The seventh transistor M7 may be connected between the initialization power line Vint and the first electrode ELT1 (for example, the anode electrode) of the light emitting unit EMU. Agate electrode of the seventh transistor M7 may be connected to an (i+1)th scan line SLi+1. The seventh transistor M7 may be turned on in case that a scan signal having a gate-on voltage (for example, a low level voltage) is applied from the (i+1)th scan line SLi+1, to supply the voltage of the initialization power line Vint to the first electrode ELT1 of the light emitting unit EMU. A signal applied to the gate electrode of the seventh transistor M7 may be a signal having the same timing as the scan signal having the gate-on voltage, which is applied from the ith scan line SLi.

The voltage of the initialization power line Vint may be set as a voltage lower than a data signal. For example, the voltage of the initialization power line Vint may be set equal to or lower than a minimum voltage of the data signal.

The storage capacitor Cst may be connected between the first power line VDD and the first node N1. The storage capacitor Cst may store information on a voltage corresponding to the data signal and a threshold voltage of the first transistor M1.

The first electrode ELT1 of the light emitting unit EMU may be connected to the first transistor M1 via the sixth transistor M6. A second electrode ELT2 (for example, a cathode electrode) of the light emitting unit EMU may be connected to the second power line VSS.

Hereinafter, a pixel PXL in accordance with an embodiment will be described in more detail with reference to FIGS. 8 to 14.

FIGS. 8 to 11 are schematic plan views illustrating a pixel in accordance with an embodiment.

Figure 8:
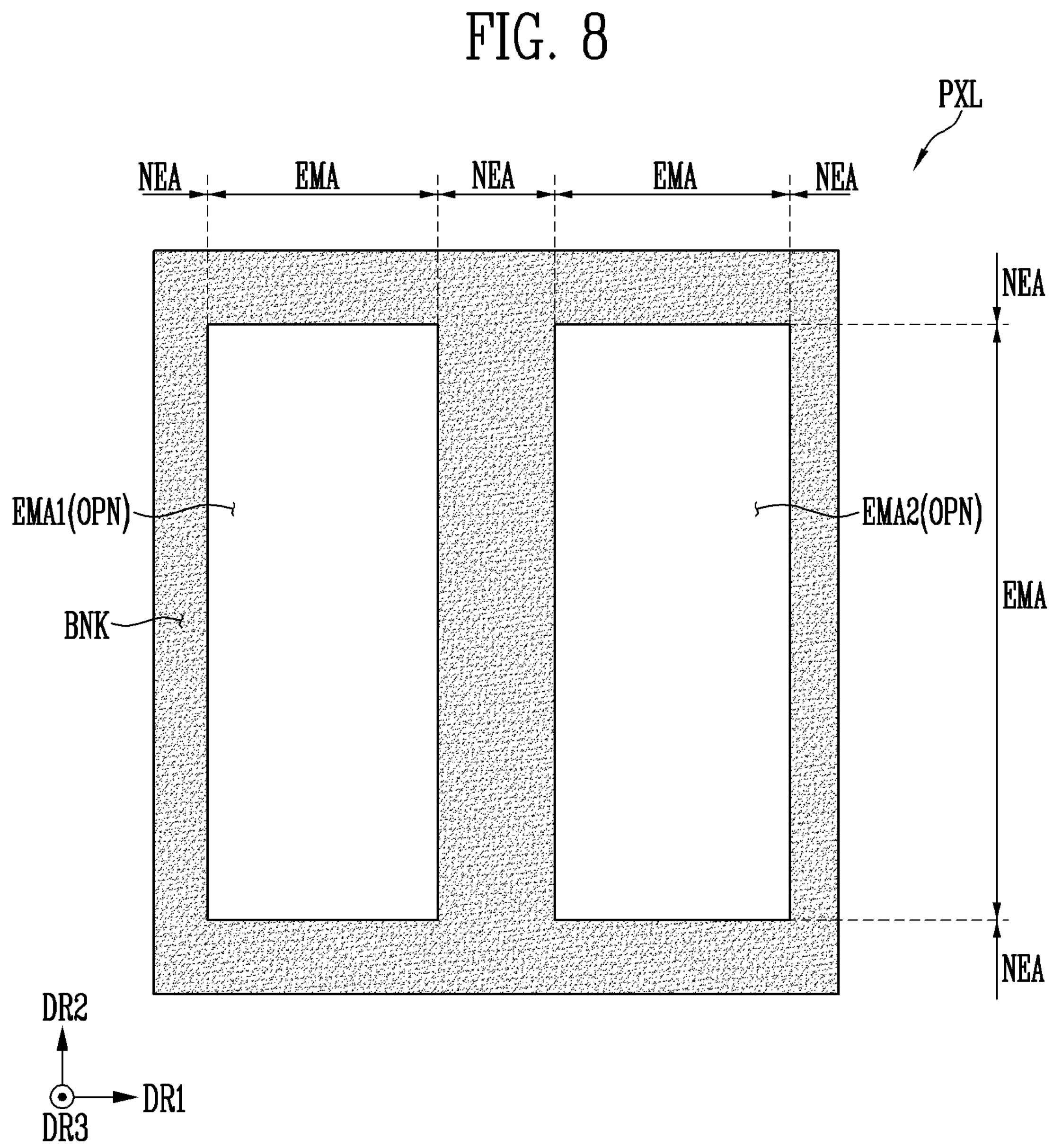
FIGS. 8 to 11 are schematic plan views illustrating a pixel in accordance with an embodiment.

FIG. 8 is a view illustrating an emission area EMA and a non-emission area NEA, and illustrates a bank BNK.

Figure 9:
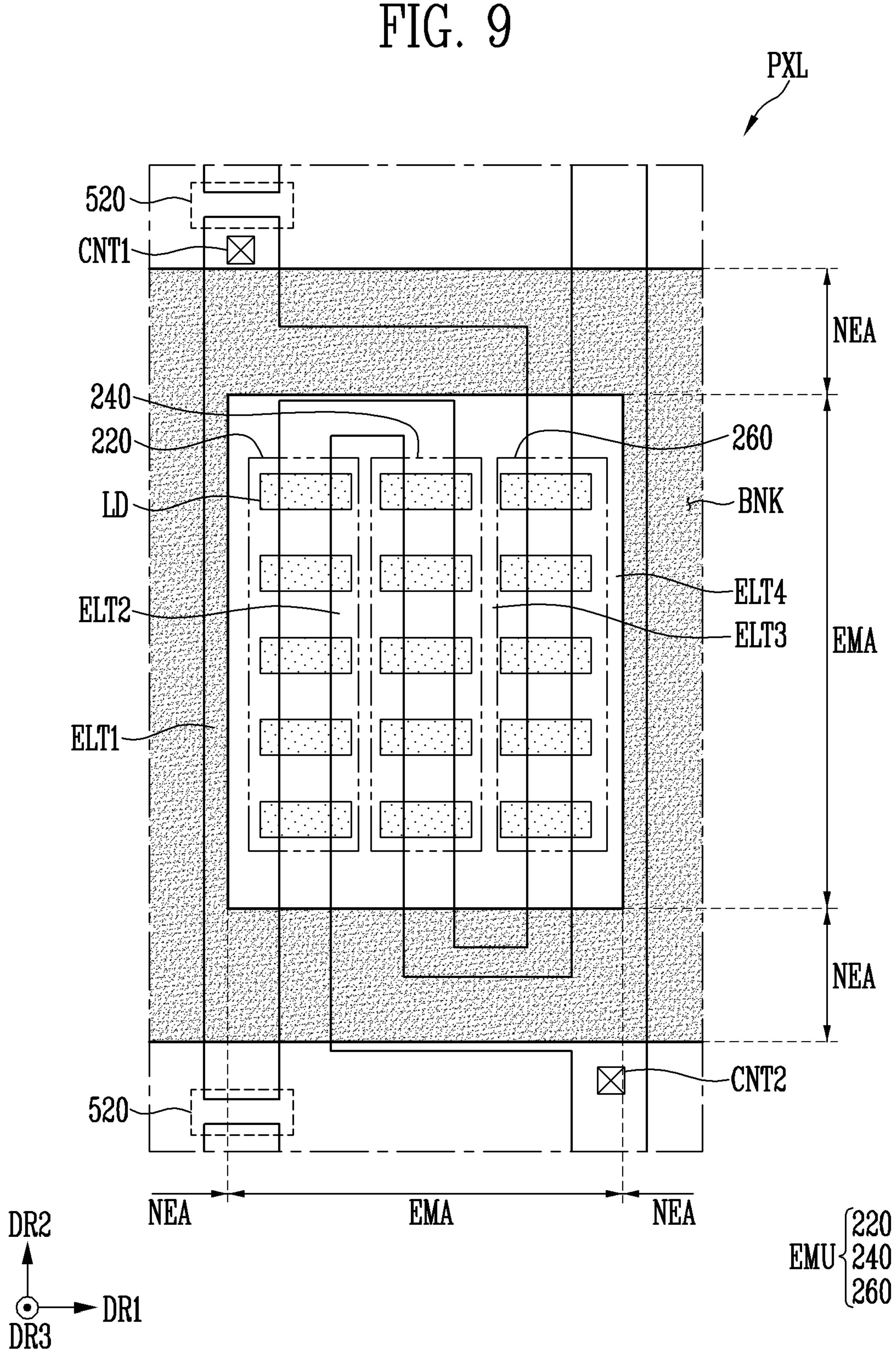
Figure 10:
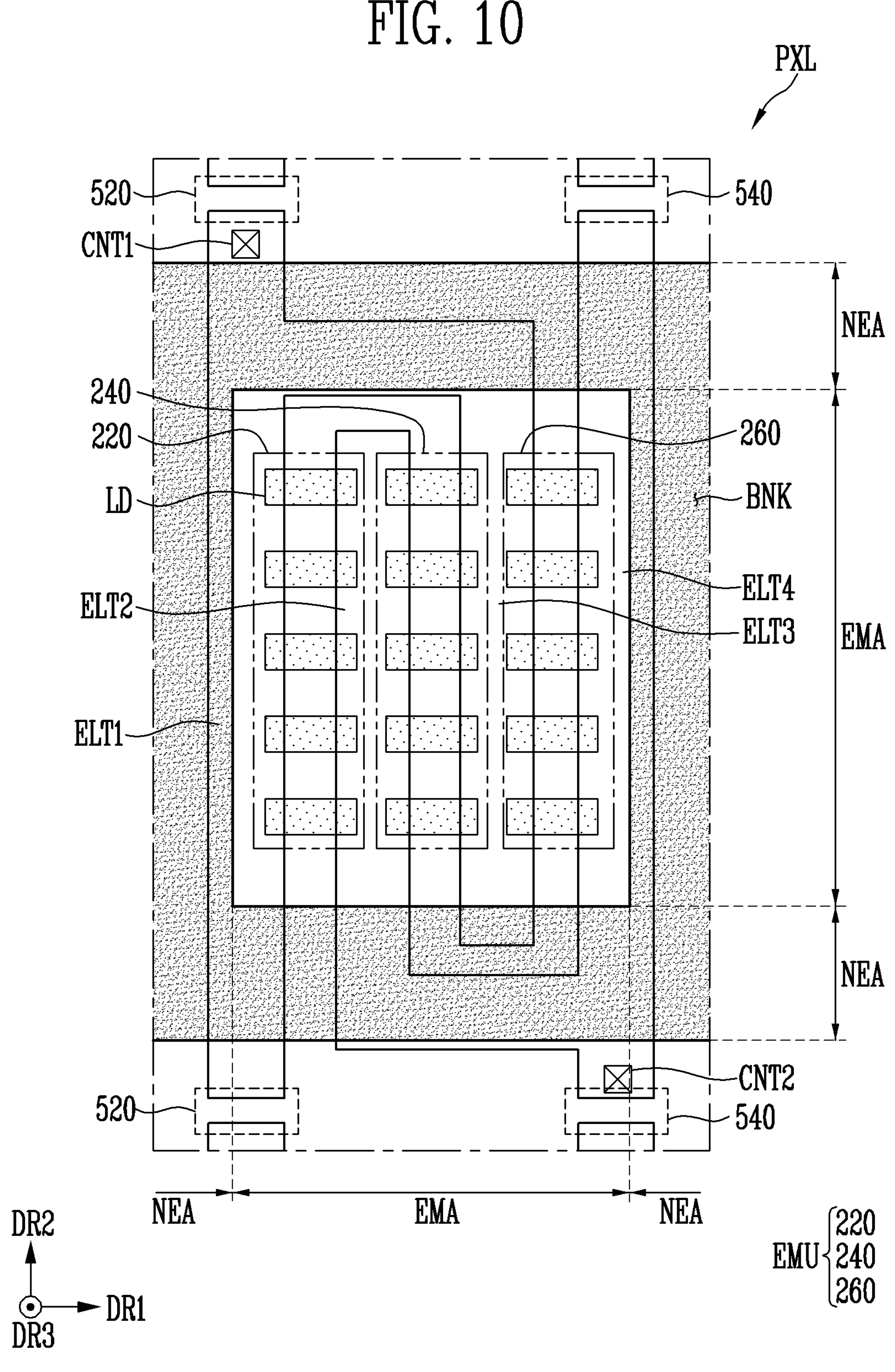
Figure 11:
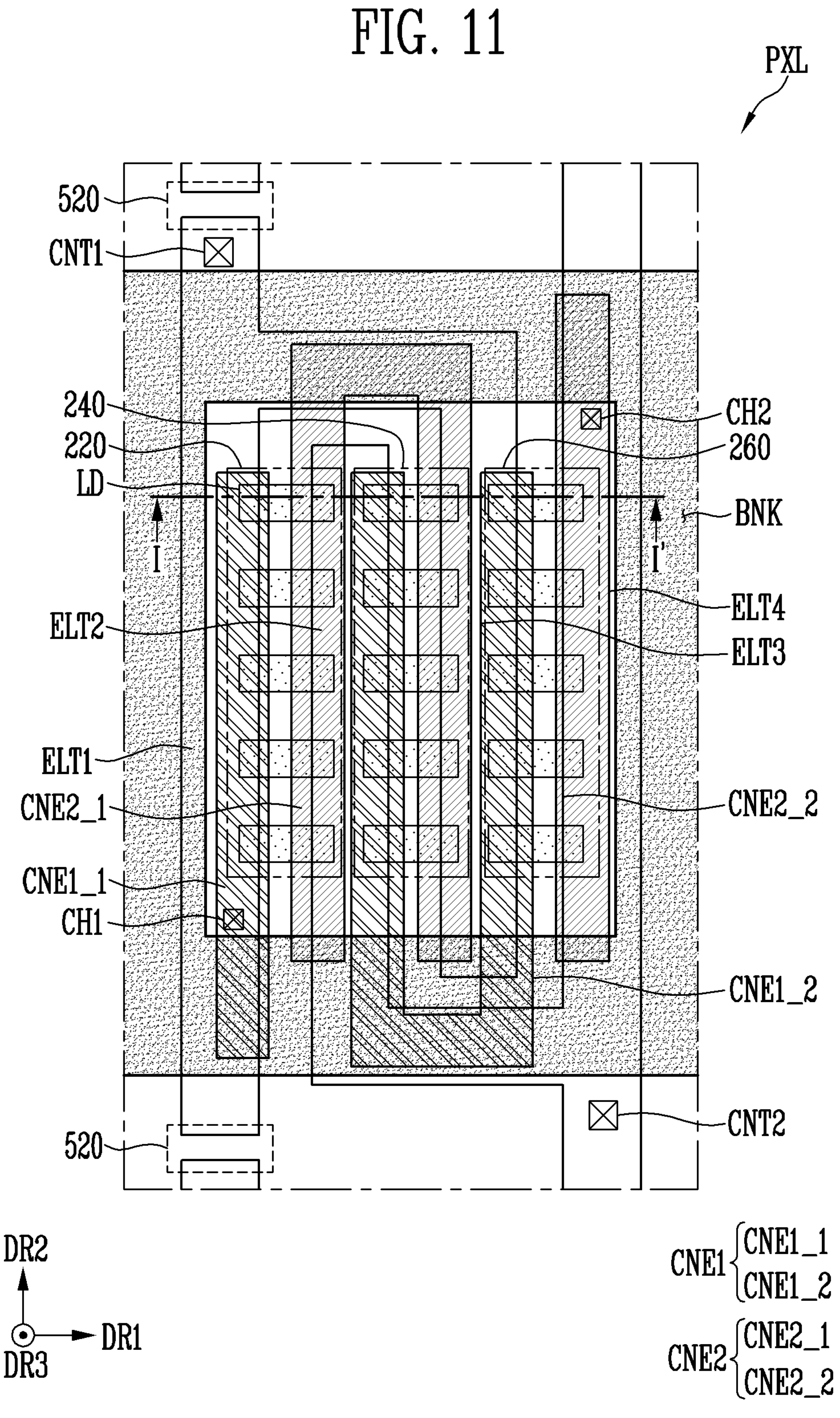

FIGS. 9 to 11 are views illustrating individual components, based on a single emission area EMA among emission areas EMA described above with reference to FIG. 8. FIGS. 9 and 10 may be views illustrating at least one light emitting element LD and first to fourth electrodes ELT1 to ELT4. FIG. 9 may be a schematic plan view illustrating a pixel PXL in accordance with an embodiment, and FIG. 10 may be a schematic plan view illustrating a pixel PXL in accordance with an embodiment. FIG. 11 may be a view illustrating a first contact electrode CNE1 and a second contact electrode CNE2.

First, an emission area EMA and a non-emission area NEA will be described with reference to FIG. 8.

Referring to FIG. 8, the pixel PXL may include an emission area EMA and a non-emission area NEA. The emission area EMA may be an area in which light is emitted. At least one light emitting element LD may be disposed in the emission area EMA. The non-emission area NEA may be an area in which the light is not emitted. The light emitting element LD may not be disposed in the non-emission area NEA.

The emission area EMA may include a first emission area EMA1 and a second emission area EMA2. For example, the substrate SUB may include the first emission area EMA1 and the second emission area EMA2.

The first emission area EMA1 and the second emission area EMA2 may be adjacent to each other with a bank BNK interposed therebetween. The first emission area EMA1 and the second emission area EMA2 may be spaced apart from each other by the bank BNK.

The first emission area EMA1 and the second emission area EMA2 may respectively correspond to positions of openings OPN defined by the bank BNK. For example, the first emission area EMA1 may overlap one of the openings OPN in a plan view. The second emission area EMA2 may overlap one of the openings OPN in a plan view.

The pixel PXL may include the bank BNK. The bank BNK may have a shape protruding in a display direction of the display device DD (for example, a third direction DR3).

The bank BNK may form (or provide) the opening OPN. For example, the bank BNK may have the shape protruding in the third direction DR3, and have a form surrounding an area. Accordingly, the opening OPN may be formed, in which the bank BNK is not disposed. In an embodiment, the bank BNK may form a space in which a fluid can be accommodated. For example, an ink including the light emitting element LD may be provided in the space in which the fluid can be accommodated, thereby disposing the light emitting element LD in the opening OPN.

The bank BNK may define the emission area EMA and the non-emission area NEA. For example, an area in which the bank BNK is disposed may be the non-emission area NEA. An area in which the light emitting element LD is disposed as an area in which the bank BNK is not disposed may be the emission area EMA. In an embodiment, the emission area EMA may be the area in which the light emitting element LD is disposed as an area corresponding to the opening OPN.

The bank BNK may surround the emission area EMA in a plan view. For example, the bank BNK may surround at least a portion of the first emission area EMA1 in a plan view. The bank BNK may surround at least a portion of the second emission area EMA2 in a plan view.

In accordance with an embodiment, the emission area EMA may be provided in plurality. For example, one of the emission areas EMA may be adjacent to another of the emission areas EMA with the bank BNK interposed therebetween.

Each emission area EMA may correspond to one of the first to third sub-pixels SPXL1, SPXL2, and SPXL3. The emission area EMA may be included in one of the first to third sub-pixels SPXL1, SPXL2, and SPXL3.

In accordance of an embodiment, the first emission area EMA1 and the second emission area EMA2 may be emission areas of different sub-pixels SPXL. For example, while the first emission area EMA1 is an emission area EMA of the first sub-pixel SPXL1, the second emission area EMA2 may be an emission area EMA of the second sub-pixel SPXL2. While the first emission area EMA1 is an emission area EMA of the first sub-pixel SPXL1, the second emission area EMA2 may be an emission area EMA of the third sub-pixel SPXL3. While the first emission area EMA1 is an emission area EMA of the second sub-pixel SPXL2, the second emission area EMA2 may be an emission area EMA of the third sub-pixel SPXL3.

In accordance with an embodiment, a color conversion layer CCL and/or a color filter layer CFL may be disposed in an area overlapping the emission area EMA on a plane, so that each sub-pixel SPXL can provide light of a color.

However, the disclosure is not necessarily limited to the above-described example. In an embodiment, two or more emission areas EMA may be defined in a single sub-pixel SPXL. For example, both the first emission area EMA1 and the second emission area EMA2 may correspond to an emission area EMA of one of the first to third sub-pixels SPXL1, SPXL2, and SPXL3.

As described above, the light emitting element LD may be disposed in the emission area EMA. A structure of the pixel PXL will be described based on at least one light emitting element LD, first to fourth electrodes ELT1 to ELT4, a first contact electrode CNE1, and a second contact electrode CNE2 with reference to FIGS. 9 to 11. For convenience of description, a single emission area EMA is illustrated in FIGS. 9 to 11.

FIGS. 9 to 11 may illustrate a structure of the pixel PXL in accordance with an embodiment. In an embodiment, the emission area EMA shown in FIGS. 9 to 11 may correspond to one sub-pixel SPXL.

FIGS. 9 to 11 illustrate a structure of a light emitting unit EMU, in which light emitting elements LD are connected in parallel between electrodes. In FIGS. 9 to 11, an embodiment is illustrated, in which the light emitting unit EMU is connected to power lines (for example, the first power line VDD and the second power line VSS), a circuit element (for example, a circuit element included in the pixel circuit PXC), and/or a signal line (for example, the scan line SL and the data line DL) through a first contact part CNT1 and a second contact part CNT2. However, the disclosure is not necessarily limited to the above-described example.

Referring to FIGS. 9 to 11, the pixel PXL may include light emitting units in a single emission area EMA. In accordance with an embodiment, a number of the light emitting units disposed in the emission area EMA may be an odd number. For example, the light emitting unit EMU may include a first light emitting unit 220, a second light emitting unit 240, and a third light emitting unit 260. However, the disclosure is not necessarily limited to the above-described example. For example, the light emitting unit EMU may include the first light emitting unit 220, the second light emitting unit 240, and the third light emitting unit 260, and may further include a fourth light emitting unit and a fifth light emitting unit.

Hereinafter, for convenience of description, an embodiment will be described, in which the first light emitting unit 220, the second light emitting unit 240, and the third light emitting unit 260 are disposed in the emission area EMA.

Each of the first light emitting unit 220, the second light emitting unit 240, and the third light emitting unit 260 may include at least one light emitting element LD. For example, each of the first light emitting unit 220, the second light emitting unit 240, and the third light emitting unit 260 may include light emitting elements LD arranged along a second direction DR2.

Each of the first light emitting unit 220, the second light emitting unit 240, and the third light emitting unit 260 may form a serial structure in which the light emitting elements LD are sequentially electrically connected to each other. For example, the light emitting elements LD of the first light emitting unit 220, the second light emitting unit 240, and the third light emitting unit 260 may be sequentially electrically connected to each other.

The first light emitting unit 220 may correspond to one path along which the light emitting elements LD are disposed. The second light emitting unit 240 may correspond to one path along which the light emitting elements LD are disposed. The third light emitting unit 260 may correspond to one path along which the light emitting elements LD are disposed.

For example, the light emitting elements LD of the first light emitting unit 220 may be disposed (or aligned) between a first electrode ELT1 and a second electrode ELT2. The light emitting elements LD of the second light emitting unit 240 may be disposed (or aligned) between the second electrode ELT2 and a third electrode ELT3. The light emitting elements LD of the third light emitting unit 260 may be disposed (or aligned) between the third electrode ELT3 and a fourth electrode ELT4.

That light emitting elements LD are disposed between electrodes may mean that at least some or a number of the light emitting elements LD are disposed between the electrodes in a plan view. For example, that the light emitting elements LD are disposed between the first electrode ELT1 and the second electrode ELT2 may mean that at least some or a number of the light emitting elements LD are disposed between the first electrode ELT1 and the second electrode ELT2 in a plan view.

The first light emitting unit 220, the second light emitting unit 240, and the third light emitting unit 260 may be adjacent to each other along a first direction DR1. For example, the first light emitting unit 220, the second light emitting unit 240, and the third light emitting unit 260 may not overlap each other in the second direction DR2.

The first electrode ELT1, the second electrode ELT2, the third electrode ELT3, and the fourth electrode ELT4 may be sequentially arranged.

In this specification, the first electrode ELT1, the second electrode ELT2, the third electrode ELT3, and the fourth electrode ELT4 may be designated as alignment electrodes. An alignment electrode in the first emission area EMA1 may be designated as a first alignment electrode, and an alignment electrode in the second emission area EMA2 may be designated as a second alignment electrode. In accordance with an embodiment, each of the first alignment electrode and the second alignment electrode may include even-numbered alignment electrodes.

The first electrode ELT1, the second electrode ELT2, the third electrode ELT3, and the fourth electrode ELT4 may be spaced apart from each other. For example, the first electrode ELT1 and the second electrode ELT2 may extend in the second direction DR2, and be spaced apart from each other in the first direction DR1. The second electrode ELT2 and the third electrode ELT3 may extend in the second direction DR2, and be spaced apart from each other in the first direction DR1. The third electrode ELT3 and the fourth electrode ELT4 may extend in the second direction DR2, and be spaced apart from each other in the first direction DR1.

In accordance with an embodiment, the first electrode ELT1 and the third electrode ELT3 may have a separated pattern for each sub-pixel SPXL. For example, the first electrode ELT1 and the third electrode ELT3 may have an independent pattern for each sub-pixel SPXL, and be separated from first and third electrodes ELT1 and ELT3 of adjacent sub-pixels SPXL. For example, the first electrode ELT1 and the third electrode ELT3 may be spaced apart from an electrode of an adjacent sub-pixel SPXL with a first open area 520 interposed therebetween.

In accordance with an embodiment, the second electrode ELT2 and the fourth electrode ELT4 may be electrically connected to a second electrode ELT2 and a fourth electrode ELT4 of another adjacent sub-pixel SPXL (see FIG. 9). For example, any separate open area may not be provided adjacent to the second electrode ELT2 and the fourth electrode ELT4.

However, the disclosure is not limited to the above-described example. In accordance with an embodiment, the second electrode ELT2 and the fourth electrode ELT4 may have a separated pattern for each sub-pixel SPXL (see FIG. 10). For example, the second electrode ELT2 and the fourth electrode ELT4 may have an independent pattern for each sub-pixel SPXL, and be separated from a second electrode ELT2 and a fourth electrode ELT4 of an adjacent sub-pixel SPXL. For example, the second electrode ELT2 and the fourth electrode ELT4 may be spaced apart from an electrode of an adjacent sub-pixel SPXL with a second open area 540 interposed therebetween.

The first electrode ELT1 and the third electrode ELT3 may be electrically connected to a circuit element (for example, a transistor included in the pixel circuit PXC), a power line (for example, the first power line VDD), and a signal line (for example, the scan line SL, the data line DL, or the like) through a first contact part CNT1.

The first electrode ELT1 and the third electrode ELT3 may provide an anode signal and/or an AC signal. The first electrode ELT1 and the third electrode ELT3 may receive an electrical signal provided through the first contact part CNT1. The electrical signal (for example, the AC signal) provided to the first electrode ELT1 and the third electrode ELT3 through the first contact part CNT1 may be an alignment signal for aligning the light emitting element LD. By way of example, the electrical signal provided to the first electrode ELT1 through the first contact part CNT1 may be an anode signal for driving the light emitting element LD.

In accordance with an embodiment, the first electrode ELT1 and the third electrode ELT3 may be integrally formed. For example, the first electrode ELT1 and the third electrode ELT3 may be electrodes branching off from one electrode component.

The second electrode ELT2 and the fourth electrode ELT4 may be electrically connected to a circuit element (for example, a transistor included in the pixel circuit PXC), a power line (for example, the second power line VSS), and a signal line (for example, the scan line SL, the data line DL, or the like) through the second contact part CNT2.

The second electrode ELT2 and the fourth electrode ELT4 may provide an electrical signal. The electrical signal provided to the second electrode ELT2 and the fourth electrode ELT4 through the second contact part CNT2 may be an alignment signal for aligning the light emitting element LD. By way of example, the electrical signal provided to the fourth electrode ELT4 through the second contact part CNT2 may be a ground signal provided to the light emitting element LD.

In accordance with an embodiment, the second electrode ELT2 and the fourth electrode ELT4 may be integrally formed. For example, the second electrode ELT2 and the fourth electrode ELT4 may be electrodes branching off from one electrode component.

Each of the electrodes disposed in the emission area EMA may alternately provide an AC signal and a ground signal so as to normally align light emitting elements LD. For example, in order to align the light emitting elements LD, the first electrode ELT1 may provide an AC signal, the second electrode ELT2 may provide a ground signal, the third electrode ELT3 may provide an AC signal, and the fourth electrode ELT4 may provide a ground signal. However, the disclosure is not limited to the above-described example. For example, the first electrode ELT1 may provide a ground signal, the second electrode ELT2 may provide an AC signal, the third electrode ELT3 may provide a ground signal, and the fourth electrode ELT4 may provide an AC signal. Hereinafter, an embodiment in which the first and third electrodes ELT1 and ELT3 provide an AC signal and the second and fourth electrodes ELT2 and ELT4 provide a ground signal will be described.

Each of the first to fourth electrodes ELT1 to ELT4 may be a single layer or a multi-layer. For example, each of the first to fourth electrodes ELT1 to ELT4 may include at least one reflective electrode layer including a reflective conductive material. Each of the first to fourth electrodes ELT1 to ELT4 may selectively further include at least one transparent electrode layer and/or at least one conductive capping layer.

The light emitting elements LD of the first light emitting unit 220 may be aligned in the second direction DR2 between the first electrode ELT1 and the second electrode ELT2.

First end portions EP1 of the light emitting elements LD of the first light emitting unit 220 may be disposed adjacent to the first electrode ELT1, and second end portions EP2 of the light emitting elements LD of the first light emitting unit 220 may be disposed adjacent to the second electrode ELT2.

The light emitting elements LD of the second light emitting unit 240 may be aligned in the second direction DR2 between the second electrode ELT2 and the third electrode ELT3.

First end portions EP1 of the light emitting elements LD of the second light emitting unit 240 may be disposed adjacent to the third electrode ELT3, and second end portions EP2 of the light emitting elements LD of the second light emitting unit 240 may be disposed adjacent to the second electrode ELT2.

The light emitting elements LD of the third light emitting unit 260 may be aligned in the second direction DR2 between the third electrode ELT3 and the fourth electrode ELT4.

First end portions EP1 of the light emitting elements LD of the third light emitting unit 260 may be disposed adjacent to the third electrode ELT3, and second end portions EP2 of the light emitting elements LD of the third light emitting unit 260 may be disposed adjacent to the fourth electrode ELT4.

Referring to FIG. 11, the pixel PXL may include a first contact electrode CNE1 and a second contact electrode CNE2. In an embodiment, the first contact electrode CNE1 may include a (1_1)th contact electrode CNE1_1 and a (1_2)th contact electrode CNE1_2 (322, 324). The second electrode CNE2 may include a (2_1)th contact electrode CNE2_1 (342, 344) and a (2_2)th contact electrode CNE2_2.

The first contact electrode CNE1 and the second contact electrode CNE2 may be patterned at different times. However, the disclosure is not limited to the above-described example. For example, the first contact electrode CNE1 and the second contact electrode CNE2 may be patterned at the same time.

The first contact electrode CNE1 and the second contact electrode CNE2 may be disposed on the first to fourth electrodes ELT1 to ELT4.

For example, the (1_1)th contact electrode CNE1_1 may be disposed on the first electrode ELT1. The (1_1)th contact electrode CNE1_1 may be disposed adjacent to the first end portion EP1 of the light emitting element LD of the first light emitting unit 220.

A portion of the (1_2)th contact electrode CNE1_2 may be disposed on the second electrode ELT2, and be disposed adjacent to the second end portion EP2 of the light emitting element LD of the second light emitting unit 240.

Another portion of the (1_2)th contact electrode CNE1_2 may be disposed on the third electrode ELT3, and be disposed adjacent to the first end portion of the light emitting element LD of the third light emitting unit 260.

A portion of the (2_1)th contact electrode CNE2_1 may be disposed on the second electrode ELT2, and be disposed adjacent to the second end portion EP2 of the light emitting element LD of the second light emitting unit 240.

Another portion of the (2_1)th contact electrode CNE2_1 may be disposed on the third electrode ELT3, and be disposed adjacent to the first end portion EP1 of the light emitting element LD of the second light emitting unit 240.

The (2_2)th contact electrode CNE2_2 may be disposed on the fourth electrode ELT4. The (2_2)th contact electrode CNE2_2 may be disposed adjacent to the second end portion EP2 of the light emitting element LD of the third light emitting unit 260.

The light emitting elements LD of the first light emitting unit 220 may be electrically connected to the first electrode ELT1 through the (1_1)th contact electrode CNE1_1. For example, the (1_1)th contact electrode CNE1_1 may be electrically connected to the first electrode ELT1 through a first contact hole CH1, and receive an anode signal for driving light emitting elements LD, which is provided from the first electrode ELT1, through the first contact hole CH1.

The light emitting elements LD of the first light emitting unit 220 may be electrically connected to a portion of the (2_1)th contact electrode CNE2_1 (for example, a portion of the (2_1)th contact electrode CNE2_1, which is disposed on the second electrode ELT2). The light emitting elements LD of the first light emitting unit 220 may receive a cathode signal (for example, a ground signal) for light emission, which is provided through the portion of the (2_1)th contact electrode CNE2_1.

The light emitting elements LD of the second light emitting unit 240 may be electrically connected to a portion of the (2_1)th contact electrode CNE2_1 (for example, a portion of the (2_1)th contact electrode CNE2_1, which is disposed on the third electrode ELT3). The light emitting elements LD of the second light emitting unit 240 may receive the anode signal for driving light emitting elements LD, which is provided through the portion of the (2_1)th contact electrode CNE2_1. In accordance with an embodiment, the (2_1)th contact electrode CNE2_1 may be electrically separated from the third electrode ELT3.

The light emitting elements LD of the second light emitting unit 240 may be electrically connected to a portion of the (1_2)th contact electrode CNE1_2 (for example, a portion of the (1_2)th contact electrode CNE1_2, which is disposed on the second electrode ELT2). The light emitting elements LD of the second light emitting unit 240 may receive a cathode signal (for example, a ground signal) for light emission, which is provided through the portion of the (1_2)th contact electrode CNE1_2.

The light emitting elements LD of the third light emitting unit 260 may be electrically connected to a portion of the (1_2)th contact electrode CNE1_2 (for example, a portion of the (1_2)th contact electrode CNE1_2, which is disposed on the third electrode ELT3). The light emitting elements LD of the third light emitting unit 260 may receive an anode signal for driving light emitting elements LD through the portion of the (1_2)th contact electrode CNE1_2.

The light emitting elements LD of the third light emitting unit 260 may be electrically connected to the fourth electrode ELT4 through the (2_2)th contact electrode CNE2_2. For example, the (2_2)th contact electrode CNE2_2 may receive a cathode signal (for example, a ground signal) for light emission of light emitting elements LD, which is provided from the fourth electrode ELT4, through a second contact hole CH2.

Consequently, the anode signal provided from the first contact par CNT1 may be applied sequentially to the first electrode ELT1, the (1_1)th contact electrode CNE1_1, the light emitting elements LD of the first light emitting unit 220, the (2_1)th contact electrode CNE2_1, the light emitting elements LD of the second light emitting unit 240, the (1_2)th contact electrode CNE1_2, the light emitting elements LD of the third light emitting unit 260, the (2_2)th contact electrode CNE2_2, and the fourth electrode ELT4.

The pixel PXL may include light emitting units 220, 240, and 260 which extend in one direction or direction (for example, the second direction DR2) and are adjacent to each other in another direction (for example, the first direction DR1). An area in which the light emitting elements LD are not disposed can be minimized, and thus the light emitting elements LD can be efficiently disposed. Accordingly, light emitting elements LD in the emission area EMA can be closely disposed. For example, occurrence of a dark spot in the emission area EMA can be prevented, and a larger number of light emitting elements LD can be disposed in the emission area EMA. Further, a phenomenon in which the light emitting elements LD are excessively adjacent to each other (for example, a phenomenon in which the light emitting elements LD are agglomerated with each other) can be prevented.

Although a case where all the light emitting elements LD are uniformly aligned in the second direction DR2 is illustrated in FIGS. 9 to 11, the disclosure is not limited thereto. For example, at least one of the light emitting elements LD may be arranged in an oblique direction or the like, which is inclined with respect to the extending direction of the first to fourth electrodes ELT1 to ELT4 (for example, the second direction DR2).

The light emitting elements LD may be provided in a form in which the light emitting elements LD are dispersed in an ink as a solvent, to be supplied to the emission area EMA through an inkjet printing process, a slit coating process, or the like within the spirit and the scope of the disclosure. In case that alignment signals are applied to the first to fourth electrodes ELT1 to ELT4 in a state in which the light emitting elements LD are supplied to each emission area EMA, the light emitting elements LD may be aligned between the first to fourth electrodes ELT1 to ELT4. After the light emitting elements LD are aligned, the solution may be removed through a drying process, or the like within the spirit and the scope of the disclosure.

Hereinafter, a sectional structure of the pixel PXL will be described with reference to FIG. 12.

Figure 12:
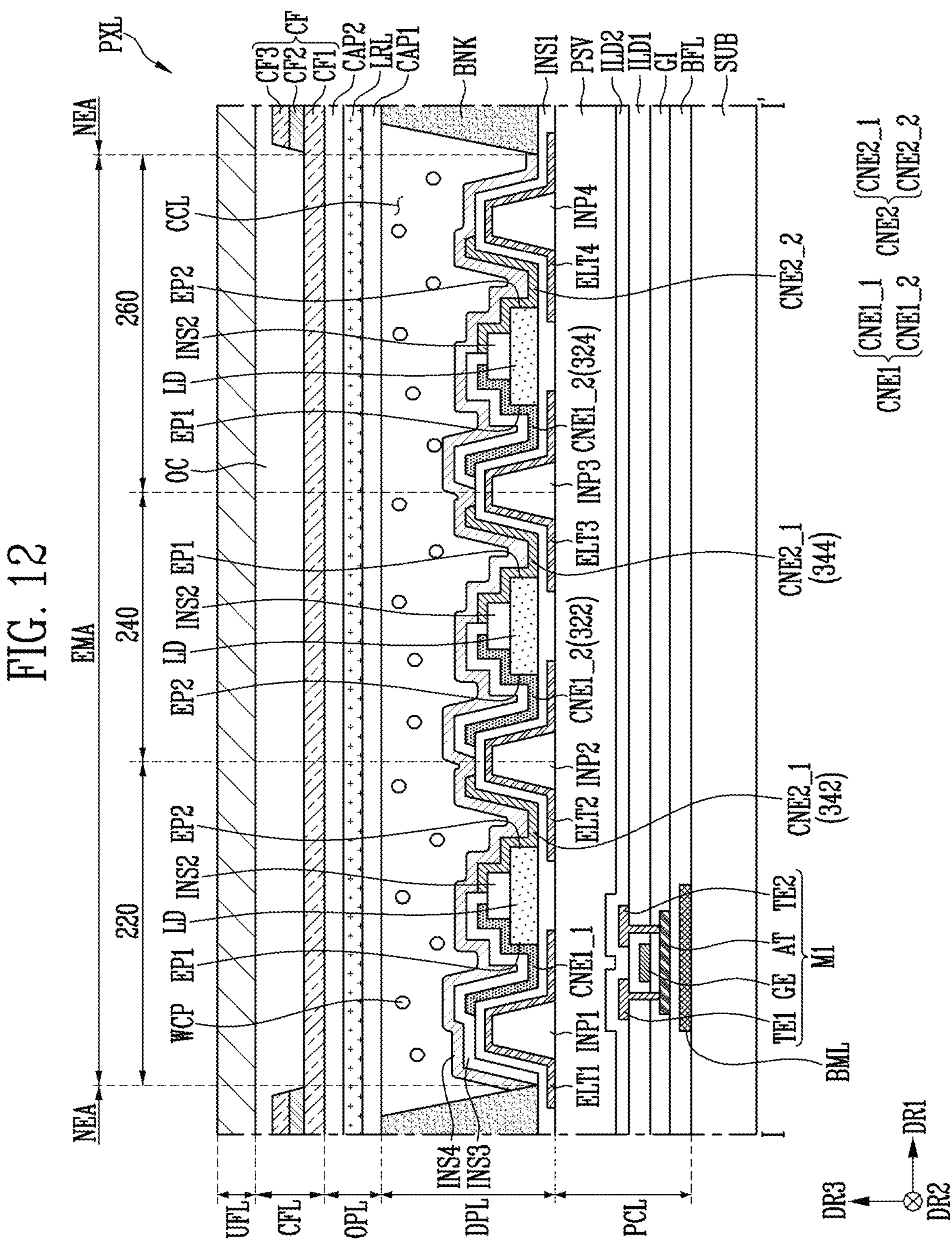
FIG. 12 is a schematic cross sectional view taken along line I-I' shown in FIG. 11.

FIG. 12 is a schematic sectional view taken along line I-I' shown in FIG. 11. FIG. 12 may be a view schematically illustrating a sectional structure of the pixel PXL in accordance with an embodiment.

Referring to FIG. 12, the pixel PXL may include a substrate SUB, a pixel circuit layer PCL, a display element layer DPL, an optical layer OPL, a color filter layer CFL, and an upper film layer.

The substrate SUB may form (or constitute) a base member of the pixel PXL. The substrate SUB may provide an area on which the pixel circuit layer PCL and the display element layer DPL can be disposed.

The pixel circuit layer PCL may be disposed on the substrate SUB. The pixel circuit layer PCL may include a lower auxiliary electrode BML, a buffer layer BFL, a first transistor M1, a gate insulating layer GI, a first interlayer insulating layer ILD1, a second interlayer insulating layer ILD2, and a protective layer PSV. For convenience of description, only the first transistor M1 among circuit elements is illustrated in FIG. 12.

The lower auxiliary electrode BML may be disposed on the substrate SUB. The lower auxiliary electrode BML may serve as a path through which an electrical signal is moved. In an embodiment, a portion of the lower auxiliary electrode BML may overlap the first transistor M1 in a plan view.

The buffer layer BFL may be disposed on the substrate SUB. The buffer layer BFL may cover the lower auxiliary electrode BML. The buffer layer BFL may prevent an impurity from being diffused from the outside. The buffer layer BFL may include one of silicon oxide ($SiO_x$), silicon nitride ($SiN_x$), silicon oxynitride ($SiO_xN_y$), aluminum oxide ($AlO_x$), and titanium oxide ($TiO_x$).

The first transistor M1 may be a thin film transistor. In accordance with an embodiment, the first transistor M1 may be a driving transistor. The first transistor M1 may be electrically connected to a light emitting element LD.

The first transistor M1 may include an active layer AT, a first transistor electrode TE1, a second transistor electrode TE2, and a gate electrode GE.

The active layer AT may mean a semiconductor layer. The active layer AT may be disposed on the buffer layer BFL. The active layer AT may include one of poly-silicon, Low Temperature Polycrystalline Silicon (LTPS), amorphous silicon, and an oxide semiconductor.

The active layer AT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate electrode GE may be disposed on the gate insulating layer GI. A position of the gate electrode GE may correspond to that of the channel region of the active layer AT. For example, the gate electrode GE may be disposed on the channel region of the active layer AT with the gate insulating layer GI interposed therebetween.

The gate insulating layer GI may be disposed over the active layer AT. The gate insulating layer GI may include one of silicon oxide ($SiO_x$), silicon nitride ($SiN_x$), silicon oxynitride ($SiO_xN_y$), aluminum oxide ($AlO_x$), and titanium oxide ($TiO_x$).

The first interlayer insulating layer ILD1 may be disposed over the gate electrode GE. The first interlayer insulating layer ILD1 may include one of silicon oxide ($SiO_x$), silicon nitride ($SiN_x$), silicon oxynitride ($SiO_xN_y$), aluminum oxide ($AlO_x$), and titanium oxide ($TiO_x$).

The first transistor electrode TE1 and the second transistor electrode TE2 may be disposed on the first interlayer insulating layer ILD1. The first transistor electrode TE1 may be in contact with the first contact region of the active layer AT while penetrating the gate insulating layer GI and the first interlayer insulating layer ILD1, and the second transistor electrode TE2 may be in contact with the second contact region of the active layer AT while penetrating the gate insulating layer GI and the first interlayer insulating layer ILD1. In an example, the first transistor electrode TE1 may be a drain electrode, and the second transistor electrode TE2 may be a source electrode. However, the disclosure is not limited thereto.

The first transistor electrode TE1 may be electrically connected to a first electrode ELT1 through a contact hole formed in the protective layer PSV The second interlayer insulating layer ILD2 may be disposed over the first transistor electrode TE1 and the second transistor electrode TE2. The second interlayer insulating layer ILD2 may include one of silicon oxide ($SiO_x$), silicon nitride ($SiN_x$), silicon oxynitride ($SiO_xN_y$), aluminum oxide ($AlO_x$), and titanium oxide ($TiO_x$).

The protective layer PSV may be disposed on the second interlayer insulating layer ILD2. The protective layer PSV may include an organic material and/or an inorganic material.

The display element layer DPL may be disposed on the pixel circuit layer PCL. The display element layer DPL may include a first insulating pattern INP1, a second insulating pattern INP2, a third insulating pattern INP3, a fourth insulating pattern INP4, the first electrode ELT1, a second electrode ELT2, a third electrode ELT3, a fourth electrode ELT4, a first insulating layer INS1, a bank BNK, a light emitting element LD, a second insulating layer INS2, a first contact CNE1, and a second contact electrode CNE2.

The first insulating pattern INP1, the second insulating pattern INP2, the third insulating pattern INP3, and the fourth insulating pattern INP4 may be disposed on the protective layer PSV The first insulating pattern INP1, the second insulating pattern INP2, the third insulating pattern INP3, and the fourth insulating pattern INP4 may protrude in a thickness direction of the substrate SUB (for example, the third direction DR3). The first insulating pattern INP1, the second insulating pattern INP2, the third insulating pattern INP3, and the fourth insulating pattern INP4 may include an organic material and/or an inorganic material.

The first insulating pattern INP1 and the second insulating pattern INP2 may be disposed adjacent to the light emitting elements LD of the first light emitting unit 220. The second insulating pattern INP2 and the third insulating pattern INP3 may be disposed adjacent to the light emitting elements LD of the second light emitting unit 240. The third insulating pattern INP3 and the fourth insulating pattern INP4 may be disposed adjacent to the light emitting elements LD of the third light emitting unit 260.

The first electrode ELT1, the second electrode ELT2, the third electrode ELT3, and the fourth electrode ELT4 may be disposed on the protective layer PSV. In accordance with an embodiment, a portion of the first electrode ELT1 may be disposed over the first insulating pattern INP1, a portion of the second electrode ELT2 may be disposed over the second insulating pattern INP2, a portion of the third electrode ELT3 may be disposed over the third insulating pattern INP3, and a portion of the fourth electrode ELT4 may be disposed over the fourth insulating pattern INP4. Therefore, each of the first electrode ELT1, the second electrode ELT2, the third electrode ELT3, and the fourth electrode ELT4 may serve as a reflective partition wall.

The first electrode ELT1 may be electrically connected to the light emitting element LD of the first light emitting unit 220. The first electrode ELT1 may be electrically connected to the light emitting element LD through a (1_1)th contact electrode CNE2_1, to provide an anode signal.

The fourth electrode ELT4 may be electrically connected to the light emitting element LD of the third light emitting unit 260. The fourth electrode ELT4 may be electrically connected to the light emitting element LD through a (2_2)th contact electrode CNE2_2, to provide a cathode signal (for example, a ground signal).

The first to fourth electrodes ELT1 to ELT4 may include a conductive material. For example, the first to fourth electrodes ELT1 to ELT4 may include one of silver (Al), magnesium (Mg), aluminum (Al), platinum (Pt), palladium (Pd), gold (Au), nickel (Ni), neodymium (Nd), iridium (Ir), chromium (Cr), titanium (Ti), and any alloy thereof. However, the disclosure is not limited to the above-described example.

The first insulating layer INS may be disposed on the protective layer PSV. The first insulating layer INS1 may cover the first to fourth electrodes ELT1 to ELT4. The first insulating layer INS1 may stabilize connection between electrode components, and reduce external influence. The first insulating layer INS1 may include one of silicon oxide ($SiO_x$), silicon nitride ($SiN_x$), silicon oxynitride ($SiO_xN_y$), aluminum oxide ($AlO_x$), and titanium oxide ($TiO_x$).

The bank BNK may be disposed on the first insulating layer INS1. The bank BNK may protrude in the thickness direction of the substrate SUB. The bank BNK may have a form surrounding the emission area EMA. In accordance with an embodiment, the bank BNK may include an organic material and/or an inorganic material. In a plan view, the bank BNK may not overlap the emission area EMA, and may overlap the non-emission area NEA.

The light emitting elements LD may be disposed on the first insulating layer INS1. The light emitting element LD of the first light emitting unit 220 may emit light, based on an electrical signal provided from the (1_1)th contact electrode CNE1_1 and a (2_1)th contact electrode CNE2_1. The light emitting element LD of the second light emitting unit 240 may emit light, based on an electrical signal provided from a (1_2)th contact electrode CNE1_2 and the (2_1)th contact electrode CNE2_1. The light emitting element LD of the third light emitting unit 260 may emit light, based on an electrical signal provided from the (1_2)th contact electrode CNE1_2 and the (2_2)th contact electrode CNE2_2.

The first contact electrode CNE1 and the second contact electrode CNE2 may include a conductive material. For example, the first contact electrode CNE1 and the second contact electrode CNE2 may include a transparent conductive material including one of Indium Tin Oxide (ITO), Indium Zinc Oxide (IZO), and Indium Tin Zinc Oxide (ITZO). However, the disclosure is not necessarily limited to the above-described example.

In accordance with an embodiment, the light emitting element LD may emit light of a third color (for example, blue). A color conversion layer CCL and the color filter layer CFL are provided on the display element layer DPL, so that a full-color image can be displayed. However, the disclosure is not necessarily limited thereto, and light emitting elements LD emitting lights of different colors may be provided.

The second insulating layer INS2 may be disposed on the light emitting element LD of each of the first to third light emitting units 220, 240, and 260. The second insulating layer INS2 may cover an active layer ACT of the light emitting element LD. The second insulating layer INS2 may include an organic material or an inorganic material.

A third insulating layer INS3 may be disposed between the first contact electrode CNE1 and the second contact electrode CNE2, to prevent an electrical short circuit. The third insulating layer INS3 may be disposed on the first insulating layer INS1 and the (1_1)th contact electrode CNE1_1 in the first light emitting unit 220. The third insulating layer INS3 may be disposed on the first insulating layer INS1 and the (1_2)th contact electrode CNE2_1 in the second light emitting unit 240. The third insulating layer INS3 may be disposed in the first insulating layer INS1 and the (1_2)th contact electrode CNE1_2 in the third light emitting unit 260. The third insulating layer INS3 may include one material among silicon oxide ($SiO_x$), silicon nitride ($SiN_x$), silicon oxynitride ($SiO_xN_y$), aluminum oxide ($AlO_x$), and titanium oxide ($TiO_x$).

A fourth insulating layer INS4 may cover components of the display element layer DPL. The fourth insulating layer INS4 may be disposed over the third insulating layer INS3 and the second contact electrode CNE2. The fourth insulating layer INS4 may protect the components of the display element layer DPL. The fourth insulating layer INS4 may include one material among silicon oxide ($SiO_x$), silicon nitride ($SiN_x$), silicon oxynitride ($SiO_xN_y$), aluminum oxide ($AlO_x$), and titanium oxide ($TiO_x$).

In accordance with an embodiment, the display element layer DPL may further include the color conversion layer CCL. However, the disclosure is not limited to the above-described example. In an embodiment, the color conversion layer CCL may be separately provided in a layer different from a layer in which the display element layer DPL is provided.

The color conversion layer CCL may overlap the display element layer DPL in a plan view. The color conversion layer CCL may allow a wavelength of light provided from the light emitting element LD to be changed or transmitted therethrough.

For example, in case that the sub-pixel SPXL is a first sub-pixel SPXL1 emitting light of a first color (for example, red), a wavelength conversion pattern WCP of the color conversion layer CCL may include first color conversion particles for converting light of the third color into light of the first color. The first color conversion particles may include a first quantum dot for converting light of blue into light of red. The first quantum dot may absorb blue light and emit red light by shifting a wavelength of the blue light according to energy transition.

In another example, in case that the sub-pixel SPXL is a second sub-pixel SPXL2 emitting light of a second color (for example, green), the wavelength conversion pattern WCP of the color conversion layer CCL may include second color conversion particles for converting light of the third color into light of the second color. The second color conversion particles may include a second quantum dot for converting light of blue into light of green. The second quantum dot may absorb blue light and emit green light by shifting a wavelength of the blue light according to energy transition.

The first quantum dot and the second quantum dot may have shape such as a spherical shape, a pyramid shape, a multi-arm shape, a cubic nano particle, a nano wire, a nano fabric, or a nano plate particle. However, the disclosure is not necessarily limited thereto, and the shape of the first quantum dot and the second quantum dot may be variously changed.

In another example, in case that the sub-pixel SPXL is a third sub-pixel SPXL3 emitting light of the third color (for example, blue), the color conversion layer CCL may include a light transmission pattern (not shown). The light transmission pattern is used to efficiently use light emitted from the light emitting element LD, and may include light scattering particles dispersed in a matrix material such as base resin. For example, the light transmission pattern may include light scattering particles such as silica, but the material constituting the light scattering particles is not limited thereto.

The optical layer OPL may be disposed on the display element layer DPL. In accordance with an embodiment, the optical layer OPL may include a first capping layer CAP1, a low refractive layer LRL, and a second capping layer CAP2.

The first capping layer CAP1 may seal (or cover) the color conversion layer CCL. The first capping layer CAP1 may be disposed between the low refractive layer LRL and the display element layer DPL. The first capping layer CAP1 may be provided throughout the sub-pixels SPXL. The first capping layer CAP1 may prevent the color conversion layer CCL from being damaged or contaminated due to infiltration of an impurity such as moisture or air from the outside.

In accordance with an embodiment, the first capping layer CAP1 may include one of silicon nitride ($SiN_x$), silicon oxide ($SiO_x$), silicon oxynitride ($SiO_xN_y$), and aluminum oxide ($AlO_x$).

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided throughout the sub-pixels SPXL.

The low refractive layer LRL may recycle light provided from the color conversion layer CCL, thereby improving light efficiency. To this end, the low refractive layer LRL may have a refractive index lower than a refractive index of the color conversion layer CCL.

In accordance with an embodiment, the low refractive layer LRL may include a base resin and hollow particles dispersed in the base resin. The hollow particle may include a hollow silica particle. By way of example, the hollow particle may be a pore formed by porogen, but the disclosure is not necessarily limited thereto. Also, the low refractive layer LRL may include one of a zinc oxide ($ZnO_x$) particle, a titanium dioxide ($TiO_x$) particle, and a nano silicate particle, but the disclosure is not necessarily limited thereto.

The second capping layer CAP2 may be disposed on the low refractive layer LRL. The second capping layer CAP2 may be disposed between the color filter layer CFL and the low refractive layer LRL. The second capping layer CAP2 may be provided throughout the sub-pixels SPXL. The second capping layer CAP2 may prevent the low refractive layer LRL from being damaged or contaminated due to infiltration of an impurity such as moisture or air from the outside.

In accordance with an embodiment, the second capping layer CAP2 may include one of silicon nitride ($SiN_x$), silicon oxide ($SiO_x$), silicon oxynitride ($SiO_xN_y$), and aluminum oxide ($AlO_x$).

The color filter layer CFL may be disposed on the second capping layer CAP2. The color filter layer CFL or CF may be provided throughout the sub-pixels SPXL. The color filter layer CFL may include color filters CF1, CF2, and CF3, and an overcoat layer OC.

The color filters CF1, CF2, and CF3 may be provided on the second capping layer CAP2.

In accordance with an embodiment, in case that the sub-pixel SPXL is the first sub-pixel SPXL1 emitting light of the first color, an emission area in which light of the light emitting element LD is emitted may overlap a first color filter CF1 and may not overlap a second color filter CF2 and a third color filter CF3, in a plan view. An embodiment in which the sub-pixel SPXL is the first sub-pixel SPXL1 is illustrated in FIG. 12.

In accordance with an embodiment, in case that the sub-pixel SPXL is the second sub-pixel SPXL2 emitting light of the second color, the emission area in which light of the light emitting element LD is emitted may overlap the second color filter CF2 and may not overlap the first color filter CF1 and the third color filter CF3, in a plan view.

In accordance with an embodiment, in case that the sub-pixel SPXL is the third sub-pixel SPXL3 emitting light of the third color, the emission area in which light of the light emitting element LD is emitted may overlap the third color filter CF3 and may not overlap the first color filter CF1 and the second color filter CF2, in a plan view.

The first color filter CF1 allows light of the first color to be transmitted therethrough, and may allow light of the second color and light of the third color not to be transmitted therethrough. In an example, the first color filter CF1 may include a colorant of the first color.

The second color filter CF2 allows light of the second color to be transmitted therethrough, and may allow light of the first color and light of the third color not to be transmitted therethrough. In an example, the second color filter CF2 may include a colorant of the second color.

The third color filter CF3 allows light of the third color to be transmitted therethrough, and may allow light of the first color and light of the second color not to be transmitted therethrough. In an example, the third color filter CF3 may include a colorant of the third color.

The overcoat layer OC may be disposed over the color filters CF1, CF2, and CF3. The overcoat layer OC may be provided throughout the sub-pixels SPXL. The overcoat layer OC may cover a lower member including the color filters CF1, CF2, and CF3. The overcoat layer OC may prevent moisture or air from infiltrating into the above-described lower member. Also, the overcoat layer OC may protect the above-described lower member from a foreign matter such as dust.

In accordance with an embodiment, the overcoat layer OC may include an organic material such as acryl resin, epoxy resin, phenolic resin, polyamide resin, polyimide resin, unsaturated polyester resin, poly-phenylene ether resin, poly-phenylene sulfide resin, or benzocyclobutene (BCB). However, the disclosure is not necessarily limited to the above-described example.

The upper film layer UFL may be disposed on the color filter layer CFL. The upper film layer UFL may be disposed at an outer portion of the display device DD, to reduce external influence. The upper film layer UFL may be provided throughout the sub-pixels SPXL. In an embodiment, the upper film layer UFL may include one of a polyethylenephthalate (PET) film, a low reflective film, a polarizing film, and a transmittance controllable film, but the disclosure is not necessarily limited thereto.

Figure 13:
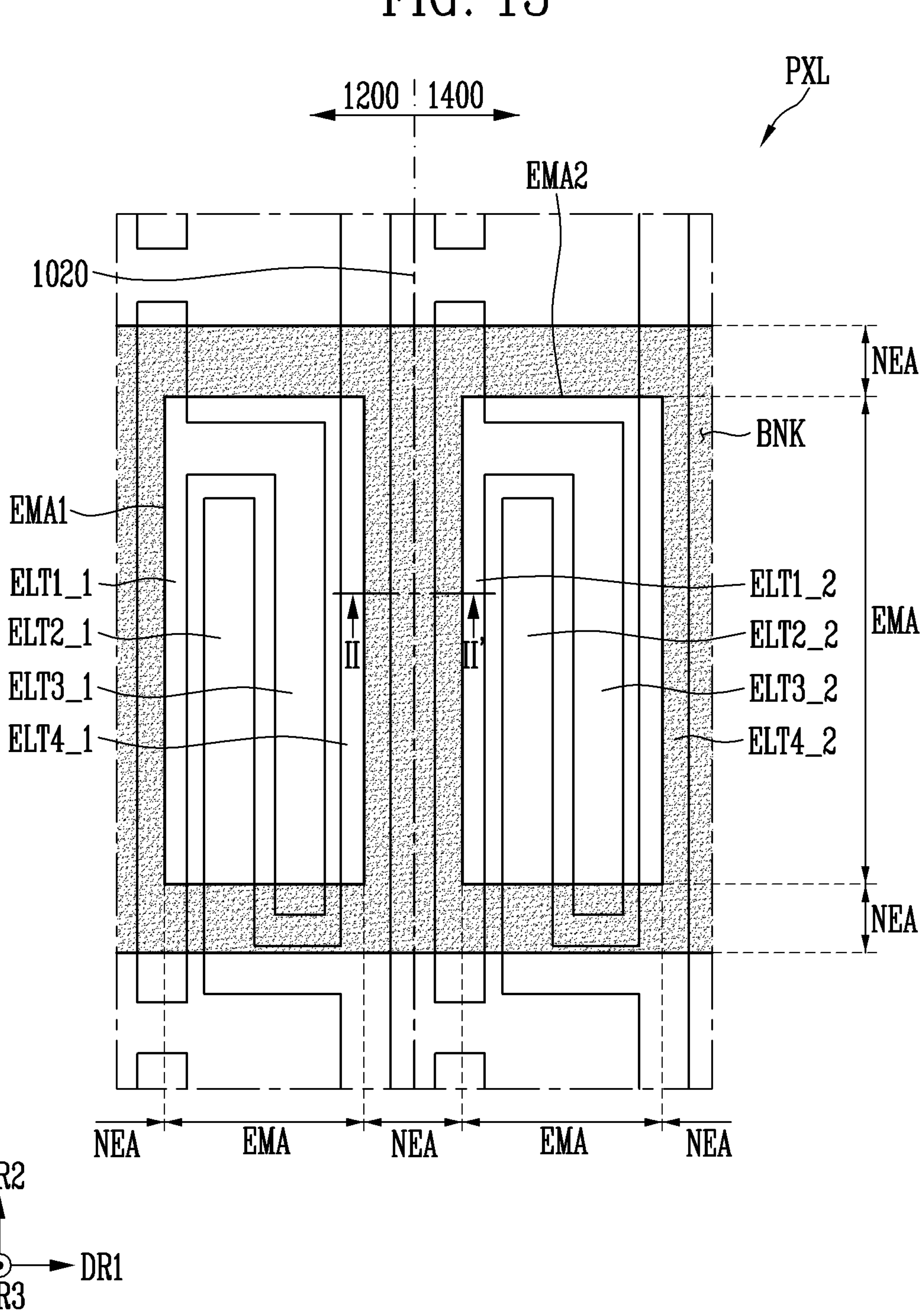
FIG. 13 is a cross plan view of a pixel in accordance with an embodiment, and is a schematic plan view illustrating emission areas.
Figure 14:
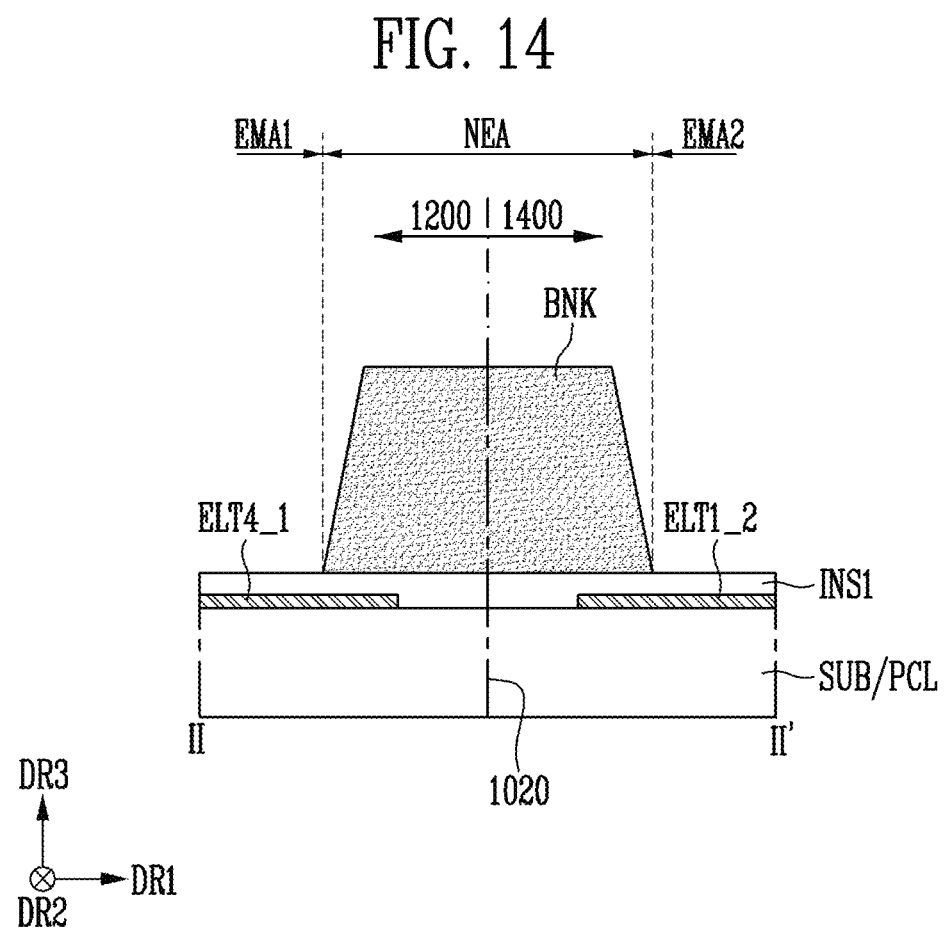

Hereinafter, the first to fourth electrodes ELT1 to ELT4 and the bank BNK, as a structure of the pixel PXL in accordance with an embodiment, will be described with reference to FIGS. 13 and 14. In FIGS. 13 and 14, portions overlapping with those described above will be simplified or omitted.

FIG. 13 is a plan view of a pixel in accordance with an embodiment, and is a plan view illustrating emission areas. FIG. 14 is a schematic sectional view taken along line II-II' shown in FIG. 13.

In FIG. 13, for convenience of description, first to fourth electrodes ELT1 to ELT4 of a first emission area EMA1 are respectively illustrated as a (1_1)th electrode ELT1_1, a (2_1)th electrode ELT2_1, a (3_1)th electrode ELT3_1, and a (4_1)th electrode ELT4_1. First to fourth electrodes ELT1 to ELT4 of a second emission area EMA2 are respectively illustrated as a (1_2)th electrode ELT1_2, a (2_2)th electrode ELT2_2, a (3_2)th electrode ELT3_2, and a (4_2)th electrode ELT4_2.

Referring to FIGS. 13 and 14, the first emission area EMA1 and the second emission area EMA2 may be spaced apart from each other with respect to a dividing line 1020. The dividing line 1020 may be a virtual line for distinguishing positions of the first emission area EMA1 and the second emission area EMA2 from each other. The dividing line 1020 may extend in a direction (for example, the second direction DR2) different from a direction (for example, the first direction DR1) in which the first emission area EMA1 and the second emission area EMA2 are adjacent to each other.

The dividing line 1020 is indicated by an alternated long and short dash line in FIG. 13. The dividing line 1020 may be a virtual line for describing a position relationship between components.

A first area 1200 may be disposed at one side or a side of the dividing line 1020, and the first emission area EMA1 may be disposed in the first area 1200. A second area 1400 may be disposed at the other side of the dividing line 1020, and the second emission area EMA2 may be disposed in the second area 1400. For example, the first emission area EMA1 may be adjacent to the dividing line 1020 at the one side or a side of the dividing line 1020, and the second emission area EMA2 may be adjacent to the dividing line 1020 at the other side of the dividing line 1020.

The dividing line 1020 may overlap the bank BNK in a plan view. The dividing line 1020 may overlap a portion of the bank BNK disposed between the first emission area EMA1 and the second emission area EMA2.

In accordance with an embodiment, an arrangement of alignment electrodes disposed in the first emission area EMA1 and an arrangement of alignment electrodes disposed in the second emission area EMA2 may correspond to each other. Arrangement (or disposition) positions of electrodes in the emission areas EMA1 and EMA2 correspond to each other, thereby improving process convenience.

For example, arrangement positions of the (1_1)th electrode ELT1_1, the (2_1)th electrode ELT2_1, the (3_1)th electrode ELT3_1, and the (4_1)th electrode ELT4_1 in the first emission area EMA1 and arrangement positions of the (1_2)th electrode ELT1_2, the (2_2)th electrode ELT2_2, the (3_2)th electrode ELT3_2, and the (4_2)th electrode ELT4_2 in the second emission area EMA2 may correspond to each other.

For example, a position of the (1_1)th electrode ELT1_1 in the first emission area EMA1 may correspond to a position of the (1_2)th electrode ELT1_2 in the second emission area EMA2. A position of the (2_1)th electrode ELT2_1 in the first emission area EMA1 may correspond to a position of the (2_2)th electrode ELT2_2 in the second emission area EMA2. A position of the (3_1)th electrode ELT3_1 in the first emission area EMA1 may correspond to a position of the (3_2)th electrode ELT3_2 in the second emission area EMA2. A position of the (4_1)th electrode ELT4_1 in the first emission area EMA1 may correspond to a position of the (4_2)th electrode ELT4_2 in the second emission area EMA2.

An alignment electrode of the first emission area EMA1, which is most adjacent to the second emission area EMA2, may be physically separated from an alignment electrode of the second emission area EMA2, which is most adjacent to the first emission area EMA1. For example, the (4_1)th electrode ELT4_1 may be physically separated from the (1_2)th electrode ELT1_2.

The dividing line 1020 may be disposed between the electrodes ELT1_1 to ELT4_1 of the first emission area EMA1 and the electrodes ELT1_2 to ELT4_2 of the second emission area EMA2. For example, the dividing line 1020 may be disposed between the (4_1)th electrode ELT4_1 and the (1_2)th electrode ELT1_2.

The (4_1)th electrode ELT4_1 and the (1_2)th electrode ELT1_2 may overlap the bank BNK in a plan view, and be spaced apart from each other under or below the bank BNK.

In accordance with an embodiment, in case that a process of aligning light emitting elements LD is performed, an AC signal and a ground signal may be alternately provided to each of the (1_1)th to (4_1)th electrodes ELT1_1 to ELT4_1. Similarly, in case that a process of aligning light emitting elements LD is performed, an AC signal and a ground signal may be alternately provided to each of the (1_2)th to (4_2)th electrodes ELT1_2 to ELT4_2.

For example, the (1_1)th electrode ELT1_1 and the (3_1)th electrode ELT3_1 may provide an AC signal in the first emission area EMA1, and the (2_1)th electrode ELT2_1 and the (4_1)th electrode ELT4_1 may provide a ground signal in the first emission area EMA1. Accordingly, an electric field for aligning the light emitting elements LD may be formed in the first emission area EMA1.

The (1_2)th electrode ELT1_2 and the (3_2)th electrode ELT3_2 may provide an AC signal in the second emission area EMA2, and the (2_2)th electrode ELT2_2 and the (4_2)th electrode ELT4_2 may provide a ground signal in the second emission area EMA2. Accordingly, an electric field for aligning the light emitting elements LD may be formed in the second emission area EMA2.

In accordance with an embodiment, the alignment electrode of the first emission area EMA1, which is most adjacent to the second emission area EMA2, may provide a signal different from a signal provided by the alignment electrode of the second emission area EMA2, which is most adjacent to the first emission area EMA1.

For example, in case that the alignment electrode (for example, the (4_1)th electrode ELT4_1) of the first emission area EMA1, which is most adjacent to the second emission area EMA2, provides an AC signal to aligning the light emitting elements LD, the alignment electrode (for example, the (1_2)th electrode ELT1_2) of the second emission area EMA2, which is most adjacent to the first emission area EMA1, may provide a ground signal to aligning the light emitting elements LD.

By way of example, in an embodiment, in case that the alignment electrode (for example, the (4_1)th electrode ELT4_1) of the first emission area EMA1, which is most adjacent to the second emission area EMA2, provides a ground signal to aligning the light emitting elements LD, the alignment electrode (for example, the (1_2)th electrode ELT1_2) of the second emission area EMA2, which is most adjacent to the first emission area EMA1, may provide an AC signal to aligning the light emitting elements LD.

In accordance with the embodiment, the dividing line 1020 overlaps the bank BNK in a plan view, thereby increasing an alignment degree of the light emitting elements LD. Accordingly, light emission efficiency and luminance can be improved.

As described above, alignment electrodes (for example, the (4_1)th electrode ELT4_1 and the (1_2)th electrode ELT1_2) respectively adjacent to different emission areas EMA1 and EMA2 may provide different signals so as to align the light emitting elements LD. Experimentally, light emitting elements LD may be abnormally located or disposed between the alignment electrodes which provide different signals. However, in accordance with an embodiment, the dividing line 1020 between alignment electrodes (for example, the (4_1)th electrode ELT4_1 and the (1_2)th electrode ELT1_2) respectively adjacent to different emission areas EMA1 and EMA2 overlaps the bank BNK in a plan view, so that the light emitting elements LD can be prevented from being abnormally located or disposed between the alignment electrodes respectively adjacent to the different emission areas EMA1 and EMA2.

Hereinafter, a manufacturing method for the display device DD in accordance with an embodiment will be described with reference to FIGS. 15 to 25. In FIGS. 15 to 25, portions overlapping those described above will be simplified or omitted.

FIGS. 15, 16, 19, and 23 to 25 are schematic process plan views illustrating a manufacturing method for the display device in accordance with an embodiment. FIGS. 15, 16, 19, and 23 to 25 illustrate manufacturing phases of a structure corresponding to the pixel PXL described above with reference to FIG. 13.

Figure 15:
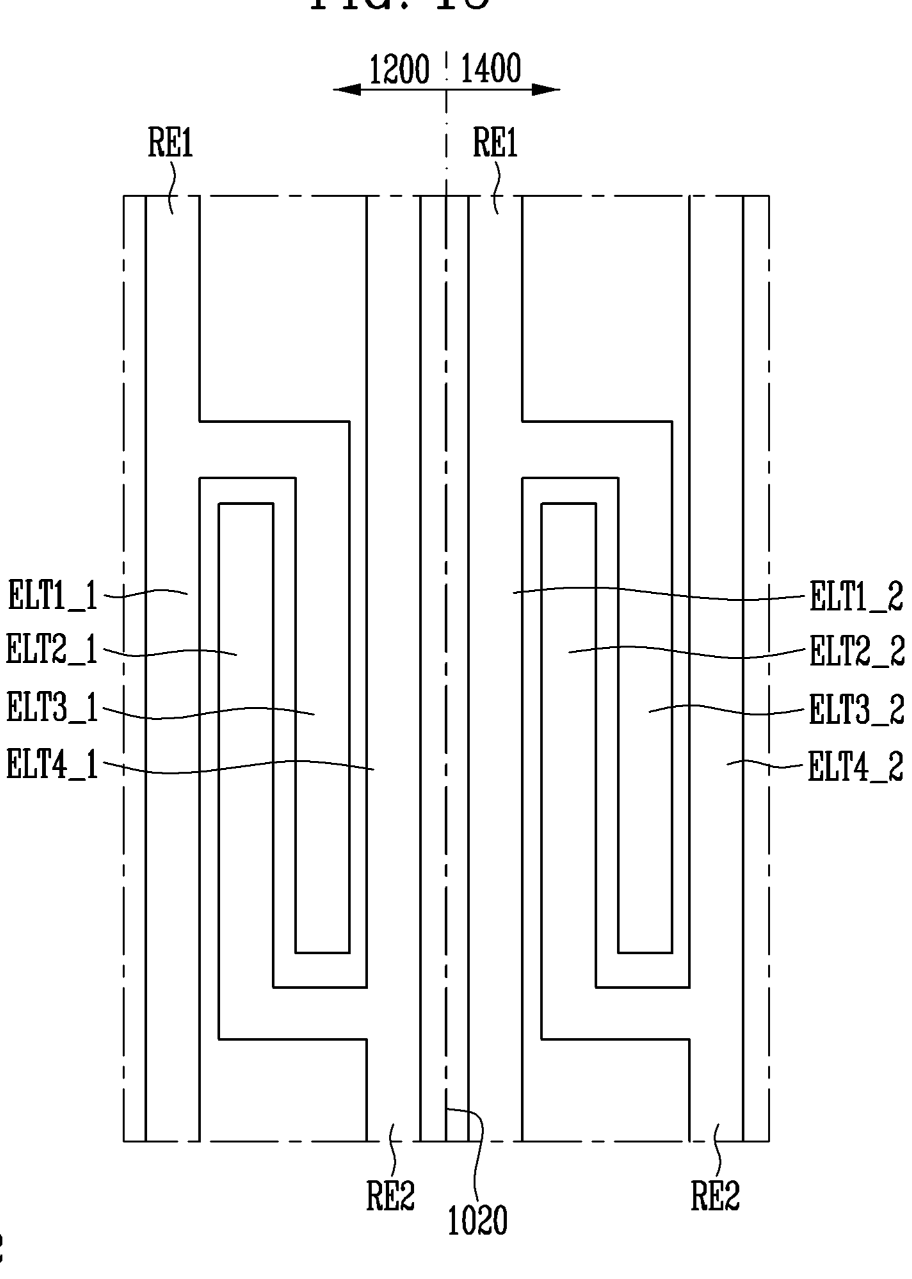
Figure 15:
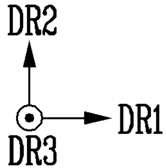
Figure 16:
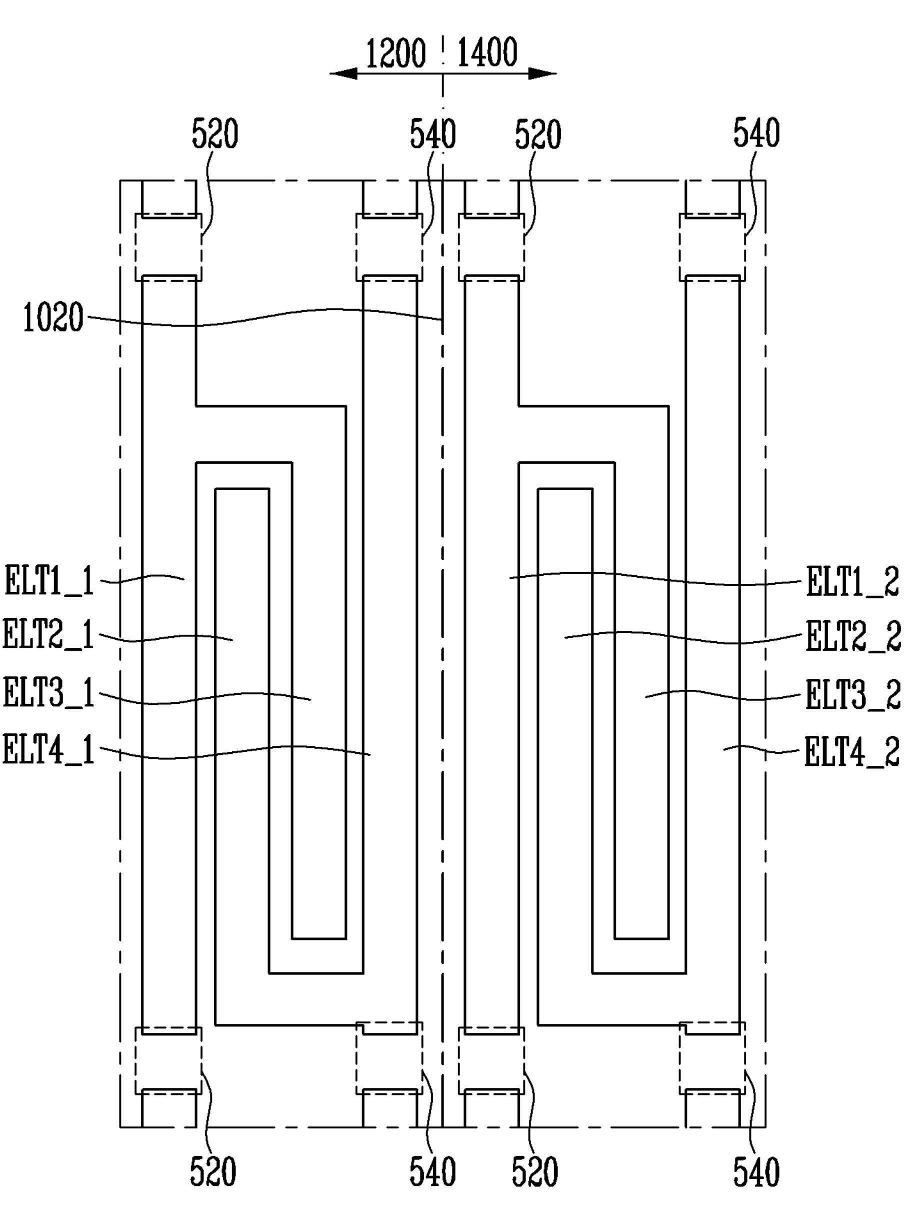
Figure 16:
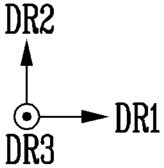
Figure 24:
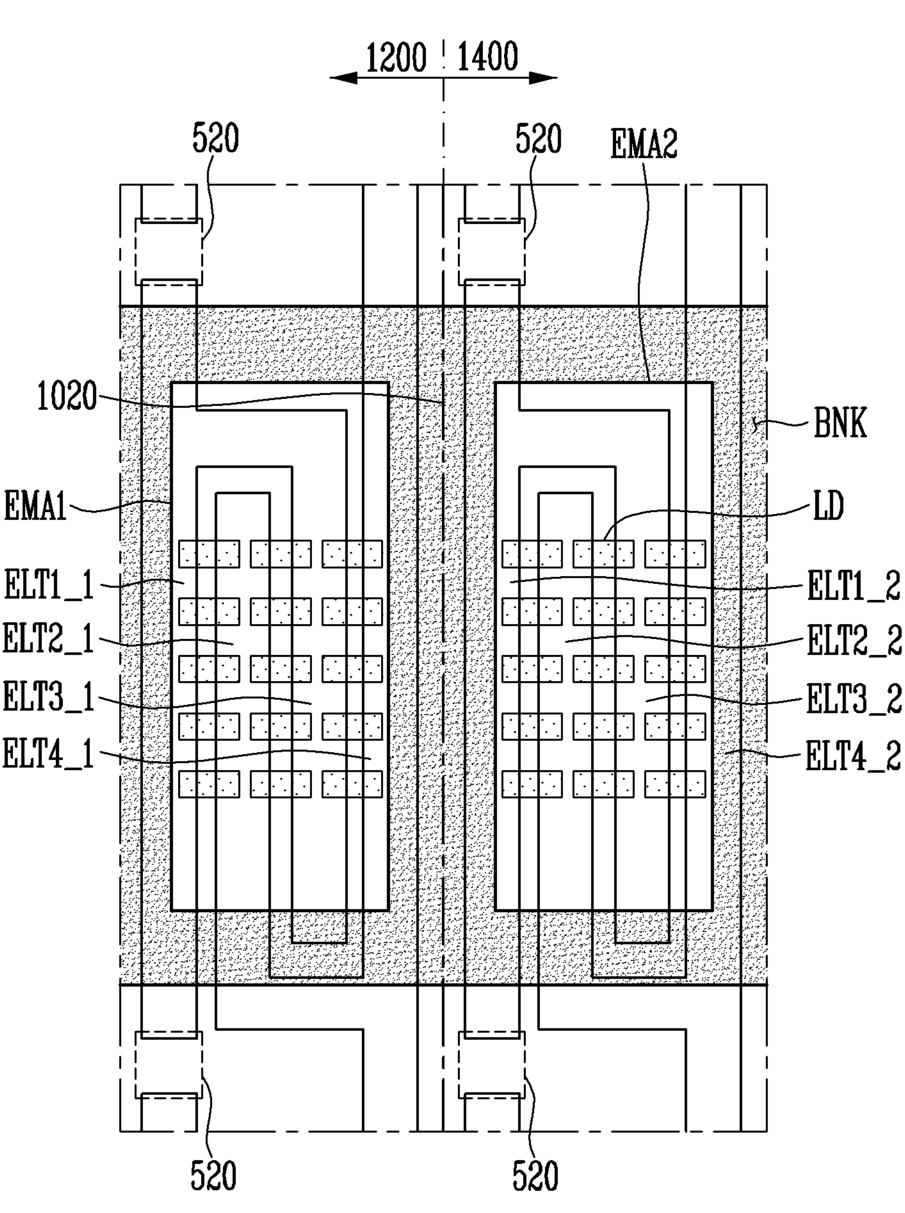
Figure 24:
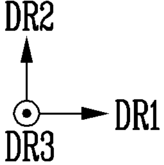
Figure 25:
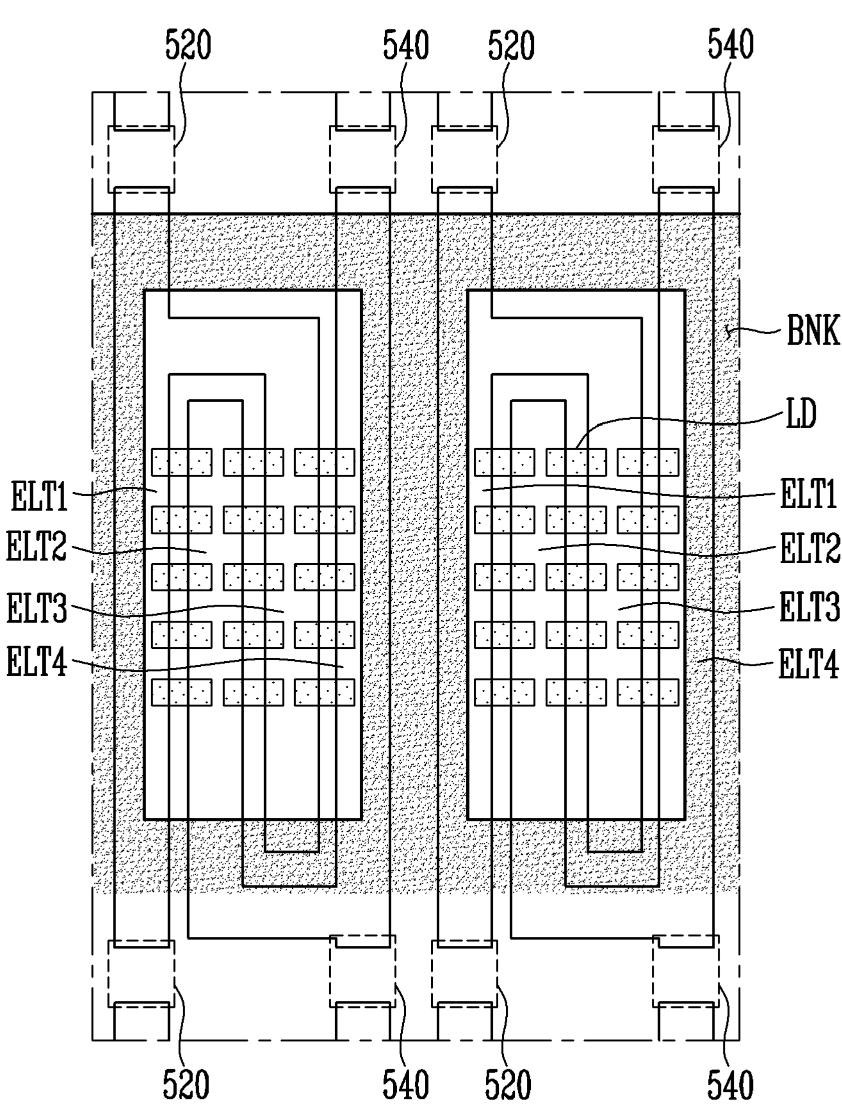
Figure 25:
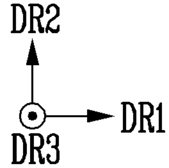

FIGS. 16 and 25 are schematic plan views illustrating a pixel PXL in accordance with a modified embodiment. For example, FIG. 16 is a plan view of a process phase shown in FIG. 15, and illustrates a process phase in accordance with a modified embodiment. FIG. 25 is a plan view of a process phase shown in FIGS. 23 and 24, and illustrates a process phase in accordance with a modified embodiment. Accordingly, the manufacturing method for the display device DD in accordance with the embodiment will be generally described with reference to FIGS. 15, 19, and 23 to 25, and embodiments modified in some phases will be additionally described with reference to FIGS. 16 and 25.

Figure 17:
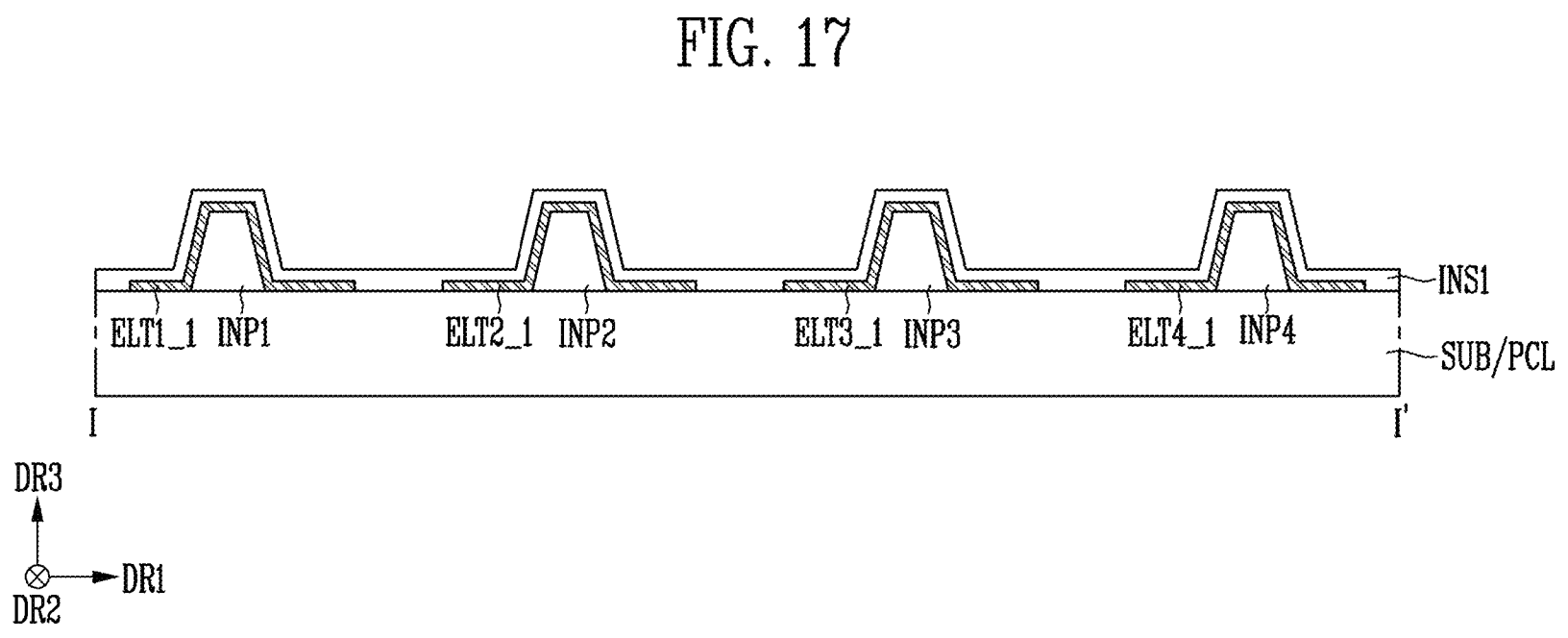
Figure 19:
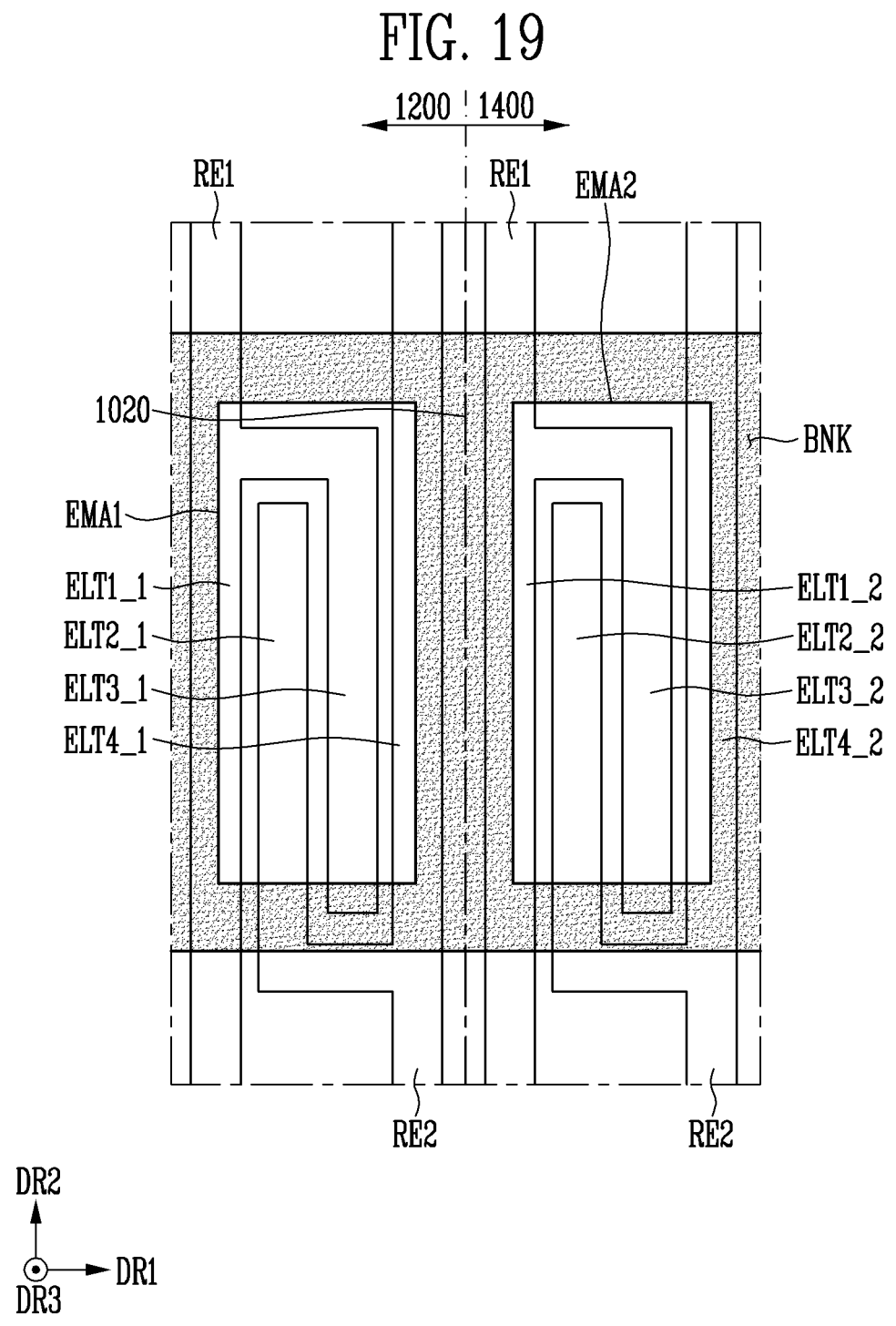
Figure 20:
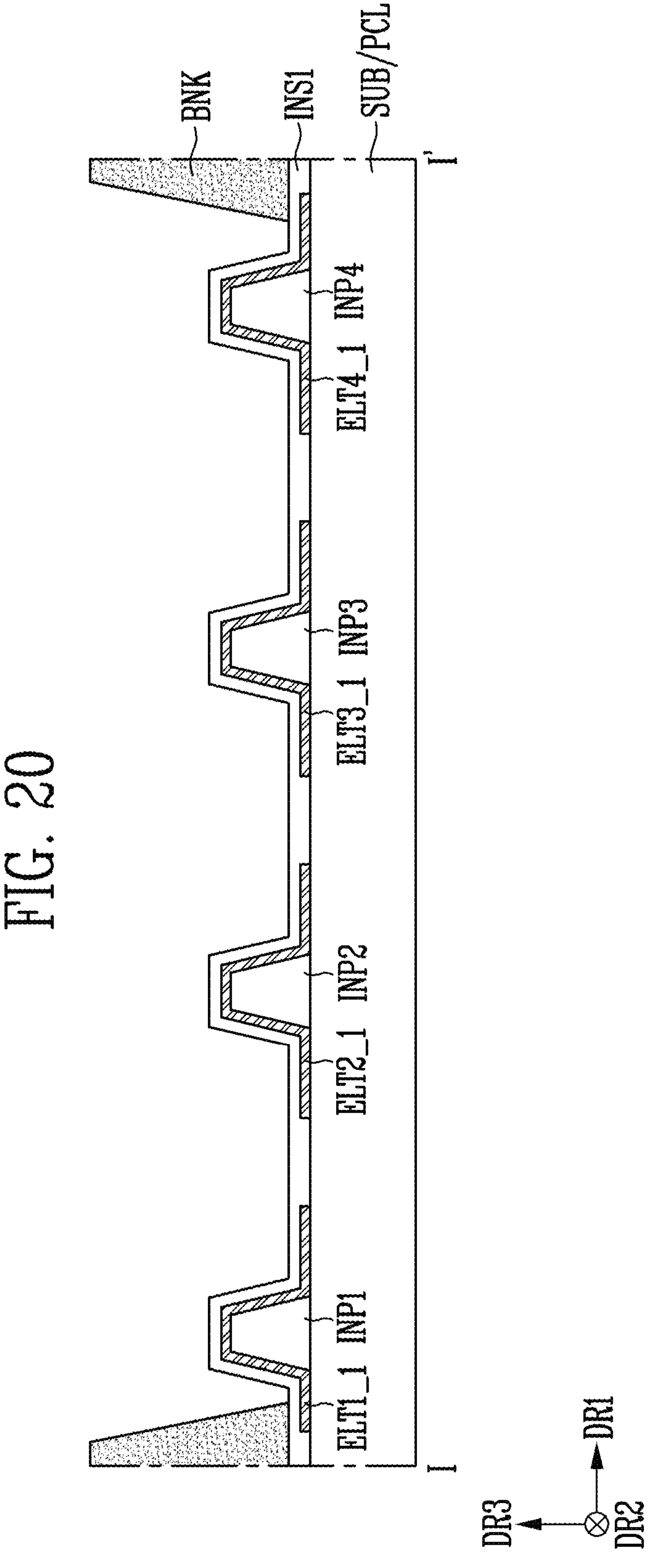
Figure 22:
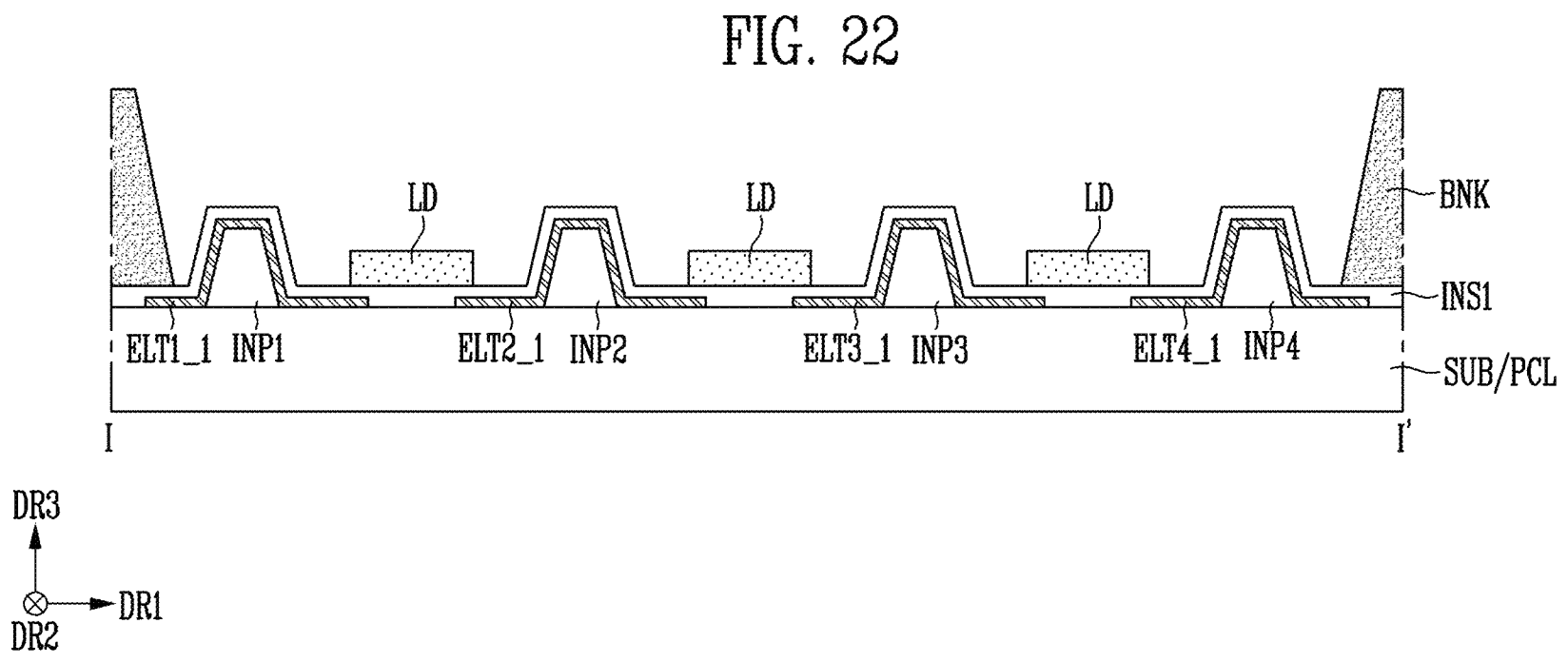

FIGS. 17, 18, and 20 to 22 are schematic process plan views illustrating a manufacturing method for the display device in accordance with an embodiment. FIGS. 17, 20, and 22 may illustrate manufacturing phases of a structure corresponding to the pixel PXL described above with reference to FIG. 12. In FIG. 20, a case where components are disposed in the first emission area EMA1 is illustrated. FIGS. 18 to 21 may illustrate manufacturing phases of a structure corresponding to the pixel PXL described above with reference to FIG. 14.

Figure 18:
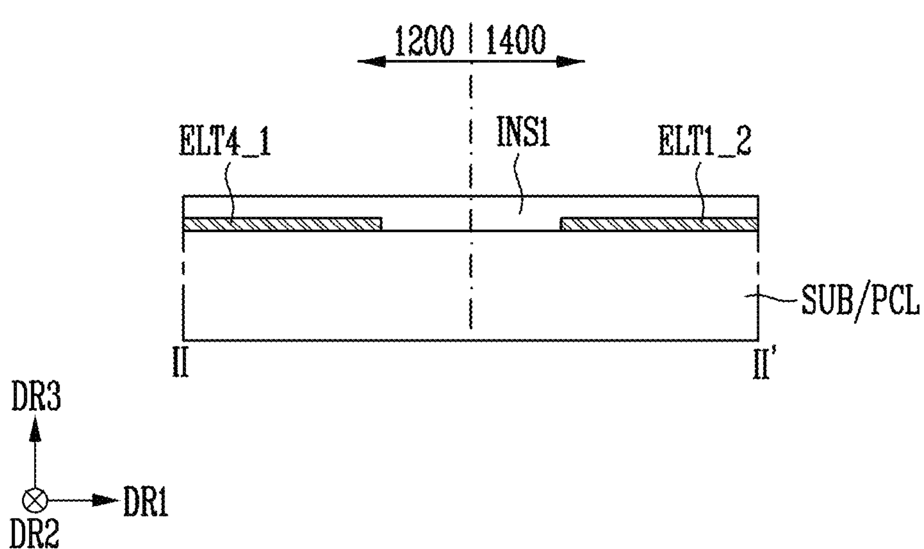

Referring to FIGS. 15, 17, and 18, a pixel circuit layer PCL may be disposed on a substrate SUB, and alignment electrodes may be disposed on the pixel circuit layer PCL. The alignment electrodes may include a first root electrode RE1, a second root electrode RE2, and first to fourth electrodes ELT1 to ELT4.

In this phase, individual components of the pixel circuit layer PCL may be formed by patterning a conductive layer, an inorganic material, an organic material, or the like through a process using an ordinary mask.

In this phase, (1_1)th to (4_1)th electrodes ELT1_1 to ELT4_1 may be disposed on the pixel circuit layer PCL. (1_2)th to (4_2)th electrodes ELT1_2 to ELT4_2 may be disposed on the pixel circuit layer PCL.

In this phase, the alignment electrodes may be patterned on the pixel circuit layer PCL. For example, the alignment electrodes may be formed by patterning a conductive layer after the conductive layer is deposited.

In this phase, the (1_1)th to (4_1)th electrodes ELT1_1 to ELT4_1 may be spaced apart from each other in the first direction DR1, and be provided to extend in the second direction DR2. The (1_2)th to (4_2)th electrodes ELT1_2 to ELT4_2 may be spaced apart from each other in the first direction DR1, and be provided to extend in the second direction DR2.

In this phase, the first root electrode RE1 and the second root electrode RE2 may be disposed. The first root electrode RE1 and the second root electrode RE2 may be respectively defined in a first area 1200 including an area corresponding to a first emission area EMA1 as a subsequent process is performed and a second area 1400 including an area corresponding to a second emission area EMA2 as a subsequent process is performed.

The first root electrode RE1 may be integrally formed with the first electrode ELT1 and the third electrode ELT3. The first root electrode RE1 may be electrically connected to the first electrode ELT1 and the third electrode ELT3.

The second root electrode RE2 may be integrally formed with the second electrode ELT2 and the fourth electrode ELT4. The second root electrode RE2 may be electrically connected to the second electrode ELT2 and the fourth electrode ELT4.

In accordance with an embodiment, the first root electrode RE1 may connect first and third electrodes ELT1 and ELT3 of adjacent sub-pixels SPXL to each other. The second root electrode RE2 may connect second and fourth electrodes ELT2 and ELT4 of adjacent sub-pixels SPXL to each other.

In this phase, the first area 1200 and the second area 1400 may be distinguished from each other with respect to a dividing line 1020. For example, the dividing line 1020 may be disposed between the (4_1)th electrode ELT4_1 and the (1_2)th electrode ELT1_2.

In this phase, before the alignment electrodes are disposed, first to fourth insulating patterns INP1 to INP4 may be disposed on the pixel circuit layer PCL. For example, the (1_1)th to (4_1)th electrodes ELT1_1 to ELT4_1 may be disposed over the first to fourth insulating patterns INP1 to INP4.

In this phase, the alignment electrodes may be disposed, and a first insulating layer INS1 may be disposed (or deposited) over the alignment electrodes.

Referring to FIG. 16, in this phase, a first open area 520 and a second open area 540 may be provided. For example, in accordance with an embodiment, the first open area 520 and the second open area 540 may be formed before light emitting elements LD are disposed.

For example, after the alignment electrodes are disposed and before the light emitting elements LD are disposed, an etching process for forming the first open area 520 and the second open area 540 may be performed. The first root electrode RE1 and the second root electrode RE2, which are described above, may be removed in this phase.

Figure 21:
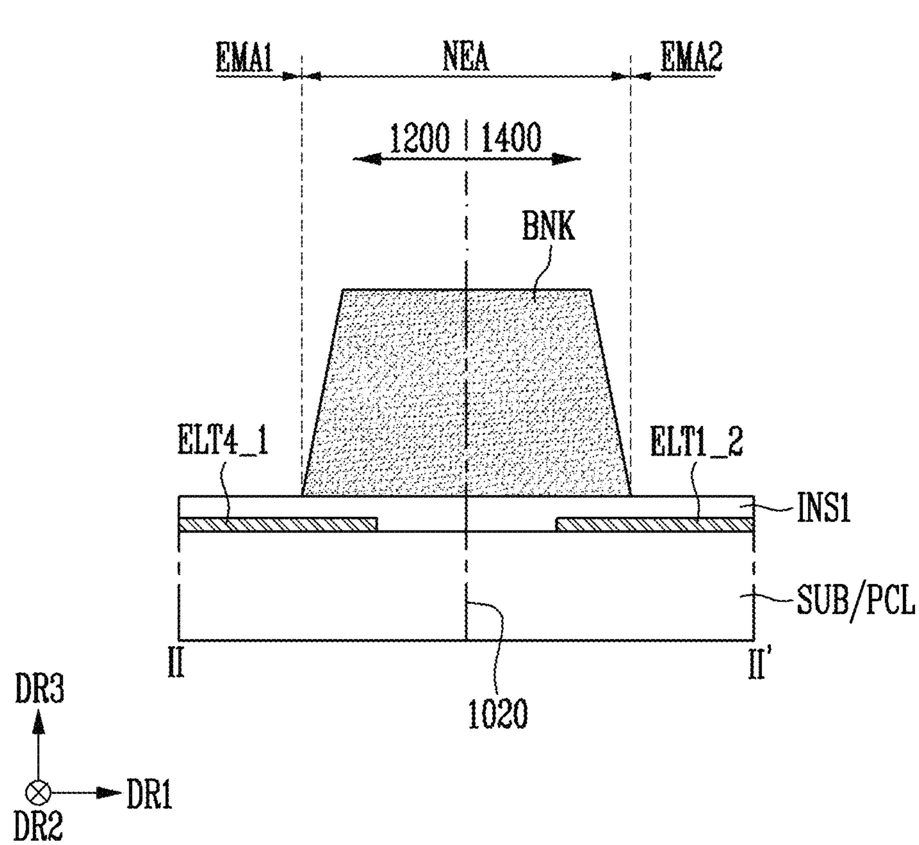

Referring to FIGS. 19 to 21, a bank BNK may be disposed on the substrate SUB. For example, the bank BNK may be provided on the first insulating layer INS1 to surround the first emission area EMA1 and the second emission area EMA2.

In this phase, the bank BNK may be disposed, to define the first emission area EMA1, the second emission area EMA2, and a non-emission area NEA. For example, the bank BNK may surround an area, to provide (or form) the first emission area EMA1 and the second emission area EMA2.

In accordance with an embodiment, the bank BNK may be disposed to overlap the dividing line 1020 in a plan view. For example, the bank BNK may overlap an area between the (4_1)th electrode ELT4_1 and the (1_2)th electrode ELT1_2, in a plan view.

Figure 23:
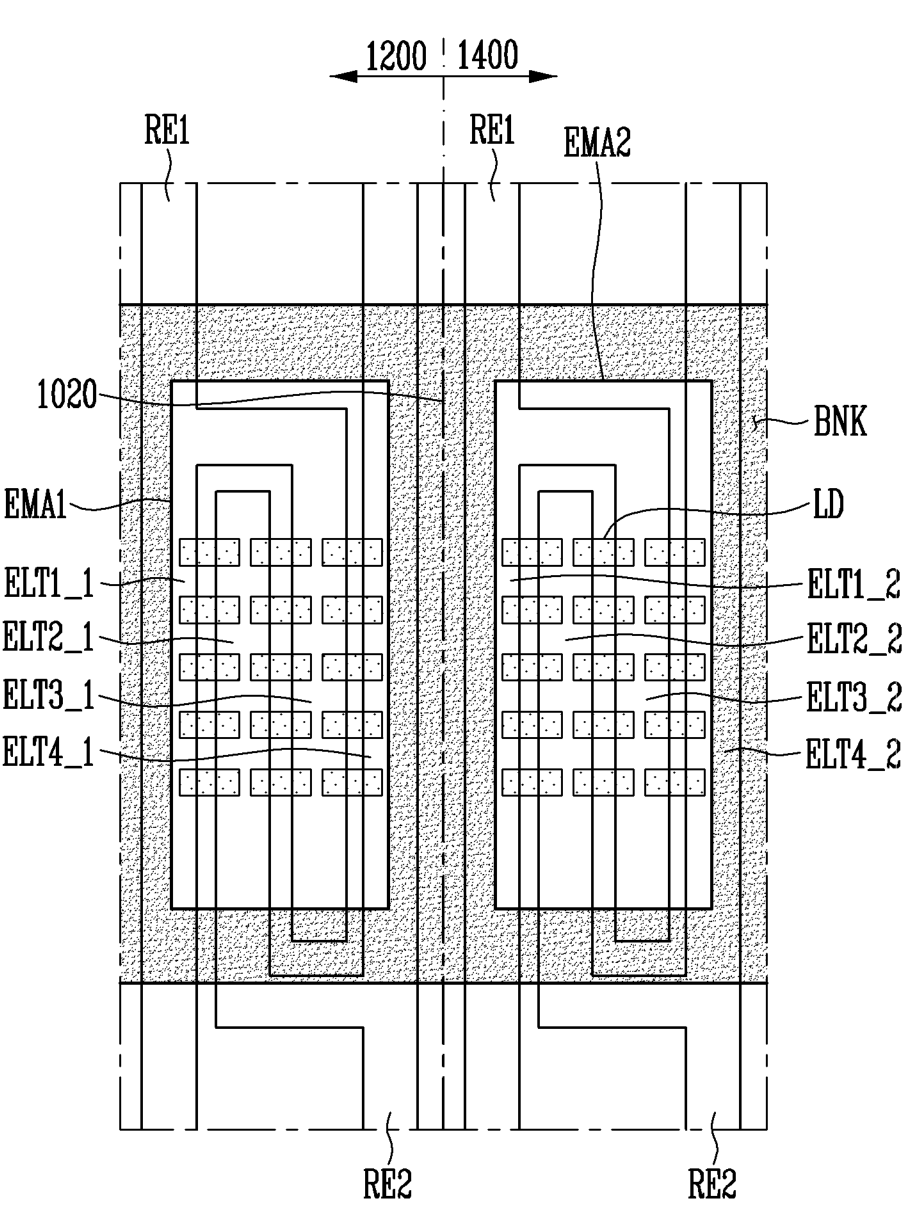
Figure 23:
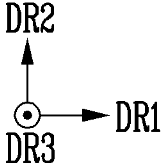

Referring to FIGS. 22 to 24, light emitting elements LD may be provided (or disposed) on the substrate SUB. The light emitting elements LD may be disposed on the first insulating layer INS1.

In this phase, light emitting elements LD may be mixed with a solvent to be provided in the form of an ink. The ink including the light emitting elements LD may be supplied to the first emission area EMA1 and the second emission area EMA2, which are defined by the bank BNK. As described above, the bank BNK may form a space in which a fluid can be accommodated. Accordingly, the supplied ink may be accommodated in the space.

In this phase, an electrical signal may be provided to the first to fourth electrodes ELT1 to ELT4, thereby forming an electric field in an area in which the light emitting elements LD are to be disposed.

For example, a first alignment signal may be provided to the first electrode ELT1 and the third electrode ELT3 through the first root electrode RE1, and a second alignment signal may be provided to the second electrode ELT2 and the fourth electrode ELT4 through the second root electrode RE2. The first alignment signal and the second alignment signal may have different waveforms, different potentials, and/or different phases. Accordingly, an electric field based on the first alignment signal and the second alignment signal may be formed, and the light emitting elements LD may be aligned based on the electric field.

The electrical signal provided through the first root electrode RE1 and the electrical signal provided through the second root electrode RE2 may be different from each other. For example, the first root electrode RE1 may provide an AC signal, thereby supplying the AC signal to the first electrode ELT1 and the third electrode ELT3. The second root electrode RE2 may provide a ground signal, thereby supplying the ground signal to the second electrode ELT2 and the fourth electrode ELT4.

Accordingly, an electrical signal provided to the (4_1)th electrode ELT4_1 as an alignment electrode of the first emission area EMA1, which is most adjacent to the second emission area EMA2, and an electrical signal provided to the (1_2)th electrode ELT1_2 as an alignment electrode of the second emission area EMA2, which is most adjacent to the first emission area EMA1, may be different from each other.

In accordance with an embodiment, the dividing line 1020 may overlap the bank BNK in a plan view. The light emitting elements LD may not be disposed at a position corresponding to the dividing line 1020. Accordingly, the light emitting elements LD can be prevented from being abnormally arranged.

Referring to FIG. 24, at least a portion of the first root electrode RE1 may be cut off (or removed), thereby providing (or forming) the first open area 520.

In this phase, at least a portion of the first root electrode RE1 may be etched. Accordingly, first and third electrodes ELT1 and ELT3 of adjacent sub-pixels SPXL can be electrically separated from each other. Thus, the sub-pixels SPXL can be individually driven.

Referring to FIG. 25, before the light emitting elements LD are disposed, the first open area 520 and the second open area 540 may be provided (or formed). Accordingly, the light emitting elements LD may be disposed after the first open area 520 and the second open area 540 are provided.

In order to align the light emitting elements LD, the first electrode ELT1 and the third electrode ELT3 may receive the first alignment signal provided through the pixel circuit layer PCL (for example, through a first contact part CNT1). The second electrode ELT2 and the fourth electrode ELT4 may receive the second alignment signal provided through the pixel circuit layer PCL (for example, through a second contact part CNT2). For example, the first alignment signal and the second alignment signal may be provided for each of the sub-pixels SPXL. The light emitting elements LD may be arranged based on the first alignment signal and the second alignment signal.

In accordance with this embodiment, the first open area 520 and the second open area 540 may be provided before the light emitting elements LD are disposed, and accordingly, an etching process for individually driving the sub-pixels SPXL may not be separately performed after the light emitting elements LD are disposed.

Subsequently, although not shown in any separate drawing, other components (for example, a first contact electrode CNE1, a second contact electrode CNE2, and the like) of a display element layer DPL may be disposed, and a color conversion layer CCL, an optical layer OPL, a color filter layer CFL, and an upper film layer UFL may be disposed, thereby providing the display device DD in accordance with an embodiment.

In accordance with the disclosure, there can be provided a display device and a manufacturing method for the same, in which luminance can be improved, and occurrence of a dark spot in an emission area can be prevented.

Example embodiments have been disclosed herein, and although specific terms are employed, they are used and are to be interpreted in a generic and descriptive sense only and not for purpose of limitation. In some instances, as would be apparent to one of ordinary skill in the art, features, characteristics, and/or elements described in connection with a given embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure and as set forth in the following claims.

What is claimed is:

1. A display device comprising:

a substrate;

a first power line and a second power line disposed on the substrate a bank disposed on the substrate, the bank surrounding at least a portion of each of a first emission area and a second emission area in a plan view;

first alignment electrodes, at least a number of the first alignment electrodes being disposed in the first emission area;

second alignment electrodes, at least a number of the second alignment electrodes being disposed in the second emission area; and a light emitting element disposed in each of the first emission area and the second emission area, wherein a first alignment electrode most adjacent to the second emission area among the first alignment electrodes and a second alignment electrode most adjacent to the first emission area among the second alignment electrodes are spaced apart from each other including a dividing line disposed between the first alignment electrode most adjacent to the second emission area among the first alignment electrodes and the second alignment electrode most adjacent to the first emission area among the second alignment electrodes, the dividing line overlaps the bank in a plan view, the first emission area and the second emission area are adjacent to each other in a first direction, the dividing line extends in a second direction different from the first direction, the first alignment electrode most adjacent to the second emission area among the first alignment electrodes provides a signal to the light emitting element in the first emission area different from a signal which the second alignment electrode most adjacent to the first emission area among the second alignment electrodes provides to the light emitting element, and the first alignment electrode is electrically connected to the second power line through a contact part and extends in the second direction without bending, and the contact part is formed in an outer peripheral area of the bank where the first emission area is not formed.

2. The display device of claim 1, wherein the first emission area and the second emission area are adjacent to each other in a first direction, and the dividing line extends in a second direction different from the first direction.

3. The display device of claim 1, wherein each of the first alignment electrodes and the second alignment electrodes include even-numbered alignment electrodes.

4. The display device of claim 3, wherein light emitting units are disposed in each of the first emission area and the second emission area, each of the light emitting units includes the light emitting element, and the light emitting units are adjacent to a first direction, and extend in a second direction different from the first direction.

5. The display device of claim 4, wherein a number of the light emitting units in each of first emission area and the second emission area is an odd number.

6. The display device of claim 4, wherein the light emitting units in each of the first emission area and the second emission area include a first light emitting unit, a second light emitting unit, and a third light emitting unit, and the first light emitting unit, the second light emitting unit, and the third light emitting unit do not overlap each other in the second direction.

7. The display device of claim 4, wherein each of the first alignment electrodes alternately provides an AC signal and a ground signal in case that the light emitting element is aligned, and each of the second alignment electrodes alternately provides an AC signal and a ground signal in case that the light emitting element is aligned.

8. The display device of claim 7, wherein the first alignment electrodes include a (1_1)th electrode, a (2_1)th electrode, a (3_1)th electrode, and a (4_1)th electrode, and the second alignment electrodes include a (1_2)th electrode, a (2_2)th electrode, a (3_2)th electrode, and a (4_2)th electrode, and the (1_1)th electrode, the (1_2)th electrode, the (3_1)th electrode, and the (3_2)th electrode provide an AC signal in case that the light emitting element is aligned, and the (2_1)th electrode, the (2_2)th electrode, the (4_1)th electrode, and the (4_2)th electrode provide a ground signal in case that the light emitting element is aligned.

9. The display device of claim 8, wherein a position of the (1_1)th electrode in the first emission area corresponds to a position of the (1_2)th electrode in the second emission area, a position of the (2_1)th electrode in the first emission area corresponds to a position of the (2_2)th electrode in the second emission area, a position of the (3_1)th electrode in the first emission area corresponds to a position of the (3_2)th electrode in the second emission area, and a position of the (4_1)th electrode in the first emission area corresponds to a position of the (4_2)th electrode in the second emission area.

10. The display device of claim 8, wherein the light emitting units in each of the first emission area and the second emission area include a first light emitting unit, a second light emitting unit, and a third light emitting unit, and the light emitting element of the first light emitting unit, the light emitting element of the second light emitting unit, and the light emitting element of the third light emitting unit are sequentially electrically connected.

11. The display device of claim 10, further comprising:

sub-pixels emitting lights of different colors, wherein the first emission area and the second emission area correspond to each of the sub-pixels, and the (1_1)th electrode and the (3_1)th electrode are separated from electrodes of another adjacent sub-pixel, and the (1_2)th electrode and the (3_2)th electrode are separated from electrodes of another adjacent sub-pixel.

12. The display device of claim 11, wherein the (2_1)th electrode and the (4_1)th electrode are separated from electrodes of another adjacent sub-pixel, and the (2_2)th electrode and the (4_2)th electrode are separated from electrodes of another adjacent sub-pixel.

13. The display device of claim 1, further comprising:

sub-pixels emitting lights of different colors, wherein the display device comprises:

a color conversion layer overlapping a display element layer in which the light emitting element is disposed in a plan view, the color conversion layer changes a wavelength of light; and a color filter layer overlapping the color conversion layer in a plan view, the color filter layer selectively transmitting light, and the first emission area and the second emission area correspond to each of the sub-pixels.

14. The display device of claim 1, wherein the dividing line is a virtual line.

15. An electronic device comprising:

the display device of claim 1.

* * * * *